(12) United States Patent
Kondo

(10) Patent No.: US 12,027,331 B2
(45) Date of Patent: Jul. 2, 2024

(54) RELAY, APPARATUS INCLUDING RELAY, AND LOAD TESTING APPARATUS INCLUDING RELAY

(71) Applicant: TATSUMI RYOKI CO., LTD, Tokyo (JP)

(72) Inventor: Toyoshi Kondo, Tokyo (JP)

(73) Assignee: TATSUMI RYOKI CO., LTD, Tokyo (JP)

( * ) Notice: Subject to any disclaimer, the term of this patent is extended or adjusted under 35 U.S.C. 154(b) by 340 days.

(21) Appl. No.: 17/624,762

(22) PCT Filed: Aug. 5, 2020

(86) PCT No.: PCT/JP2020/029976
§ 371 (c)(1),
(2) Date: Jan. 4, 2022

(87) PCT Pub. No.: WO2021/053988
PCT Pub. Date: Mar. 25, 2021

(65) Prior Publication Data
US 2022/0254590 A1  Aug. 11, 2022

(30) Foreign Application Priority Data
Sep. 17, 2019  (JP) ................. 2019-168087

(51) Int. Cl.
*H01H 50/06* (2006.01)
*G01R 31/40* (2020.01)
(Continued)

(52) U.S. Cl.
CPC ............ *H01H 50/06* (2013.01); *G01R 31/40* (2013.01); *G01R 31/42* (2013.01); *H01H 50/44* (2013.01);
(Continued)

(58) Field of Classification Search
CPC ........ H01H 50/06; H01H 50/44; H01H 50/54; H01H 50/28; H01H 2050/049;
(Continued)

(56) References Cited

U.S. PATENT DOCUMENTS

2018/0182584 A1*  6/2018  Iwamoto ................ H01H 50/18
2019/0013171 A1*  1/2019  Minowa ................. H01H 50/44
(Continued)

FOREIGN PATENT DOCUMENTS

JP      S55-35490 A     3/1980
JP      H11-273528 A    10/1999
(Continued)

OTHER PUBLICATIONS

WO 2018211574 machine translation, Nov. 12, 2018 (Year: 2018).*
(Continued)

*Primary Examiner* — Raul J Rios Russo
(74) *Attorney, Agent, or Firm* — Nakanishi IP Associates, LLC

(57) ABSTRACT

A relay includes a fixed contact, a movable contact, a return member of the movable contact, and a case that covers the fixed contact, the movable contact, and the return member. The case is made of a material having transparency or translucency. The relay RS further includes a tray portion that is disposed above the return member and below the fixed contact and holds a fusing residue generated by separation/approach of the movable contact from/to the fixed contact. The relay further includes a cap that covers a portion of a terminal connected to the fixed contact, the portion being exposed from the case. When the cap is attached to the case, at least a portion of the case is exposed without being covered with the cap.

10 Claims, 25 Drawing Sheets

(51) Int. Cl.
  *G01R 31/42* (2006.01)
  *H01H 50/04* (2006.01)
  *H01H 50/44* (2006.01)
  *H01H 50/54* (2006.01)

(52) U.S. Cl.
  CPC .......... *H01H 50/54* (2013.01); *H01H 50/047* (2013.01); *H01H 2050/049* (2013.01)

(58) Field of Classification Search
  CPC .... H01H 50/047; H01H 50/546; H01H 47/00; H01H 50/56; G01R 31/40; G01R 31/42; G01R 31/00; G01R 31/333
  USPC ..................................................... 324/764.01
  See application file for complete search history.

(56) References Cited

U.S. PATENT DOCUMENTS

| | | | |
|---|---|---|---|
| 2019/0304724 A1* | 10/2019 | Minowa | H01H 50/42 |
| 2019/0304728 A1* | 10/2019 | Minowa | H01H 49/00 |
| 2019/0317148 A1 | 10/2019 | Kondo | |
| 2022/0254590 A1* | 8/2022 | Kondo | H01H 50/44 |

FOREIGN PATENT DOCUMENTS

| | | |
|---|---|---|
| JP | 2006-12842 A | 1/2006 |
| JP | 2010-025752 A | 2/2010 |
| JP | 2014-53080 A | 3/2014 |
| WO | 2018/211574 A1 | 11/2018 |

OTHER PUBLICATIONS

Office Action issued in Taiwanese Patent Application No. 109130141 dated Oct. 26, 2023, with English Translation (17 pages).
International Search Report issued in PCT/JP2020/029976 mailed on Oct. 20, 2020 with English Translation (7 pages).

\* cited by examiner

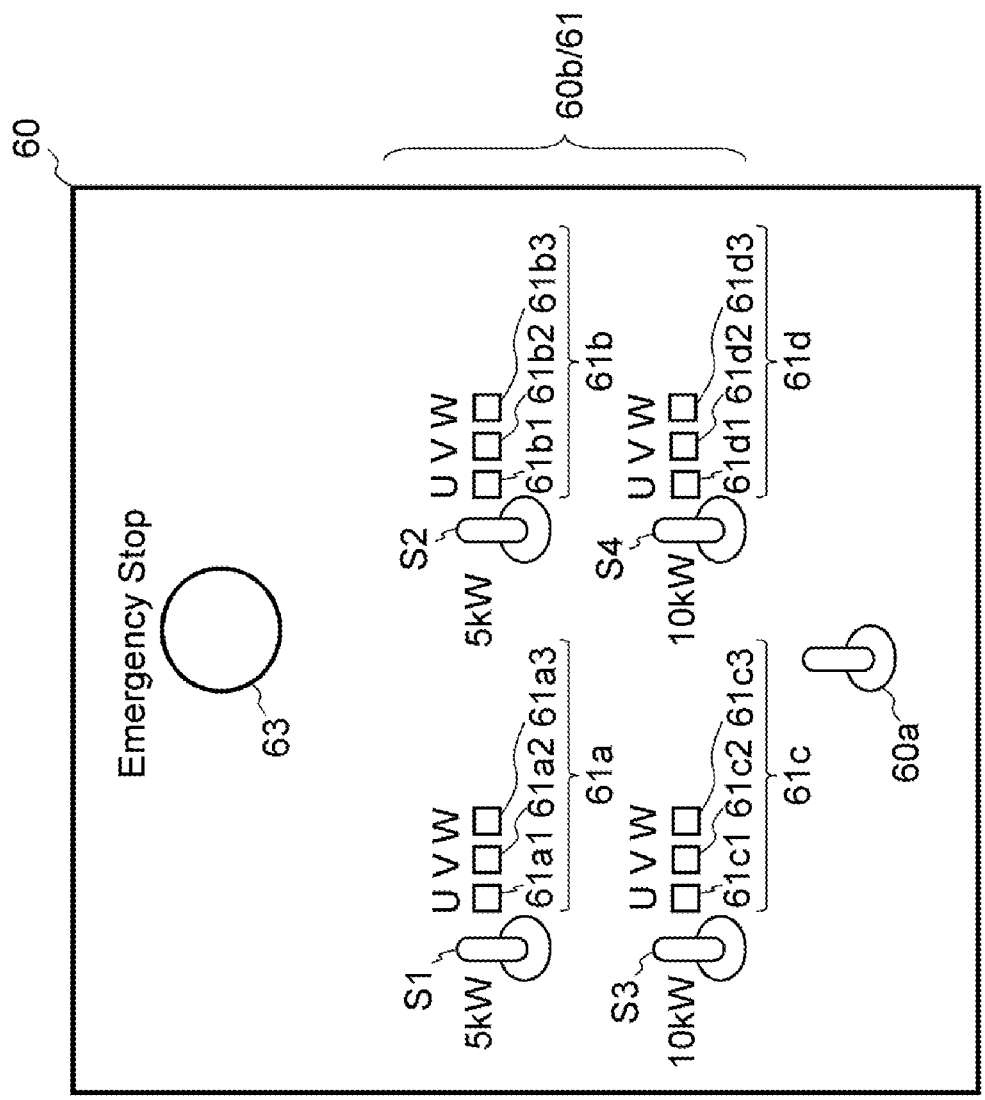

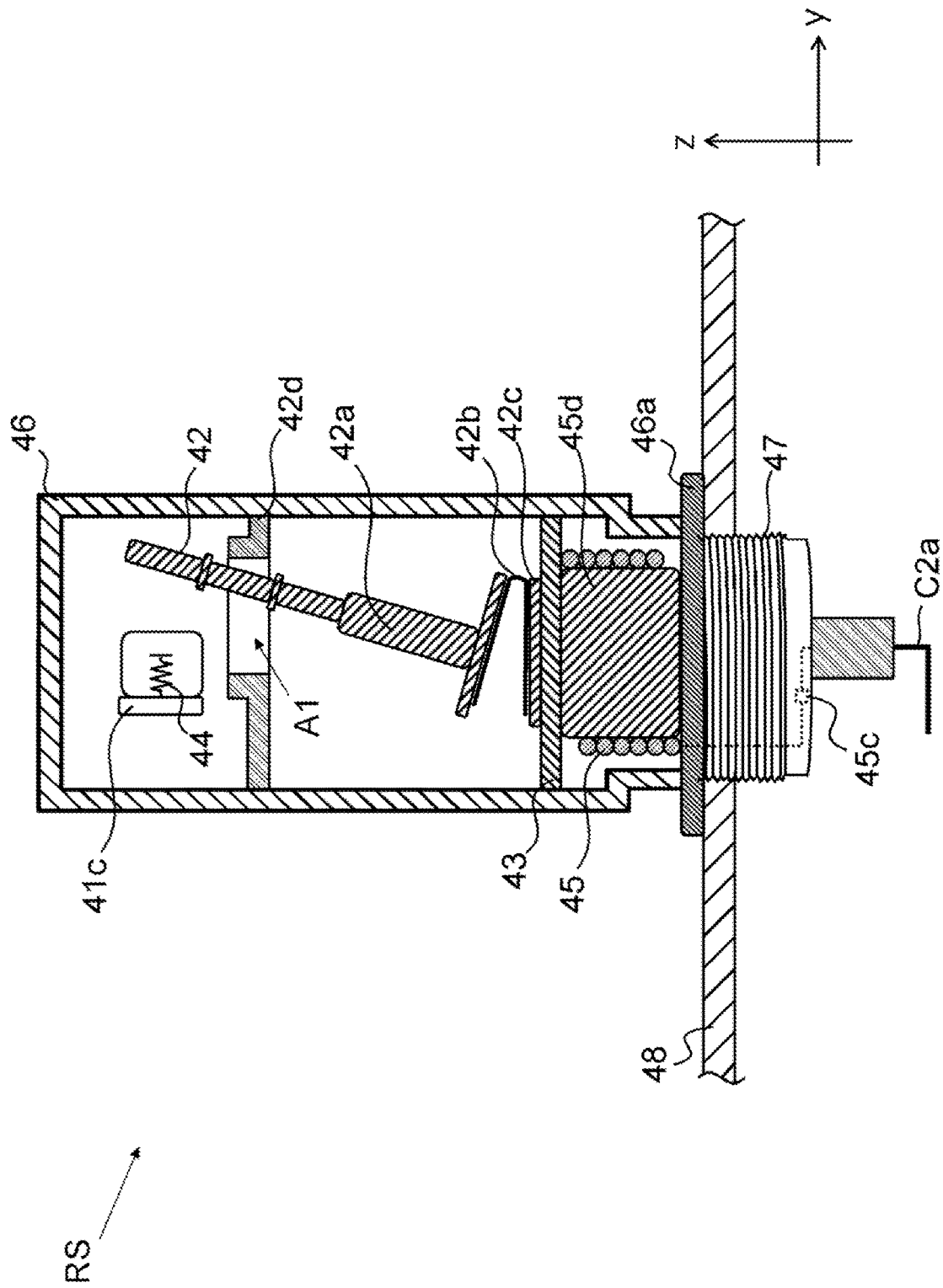

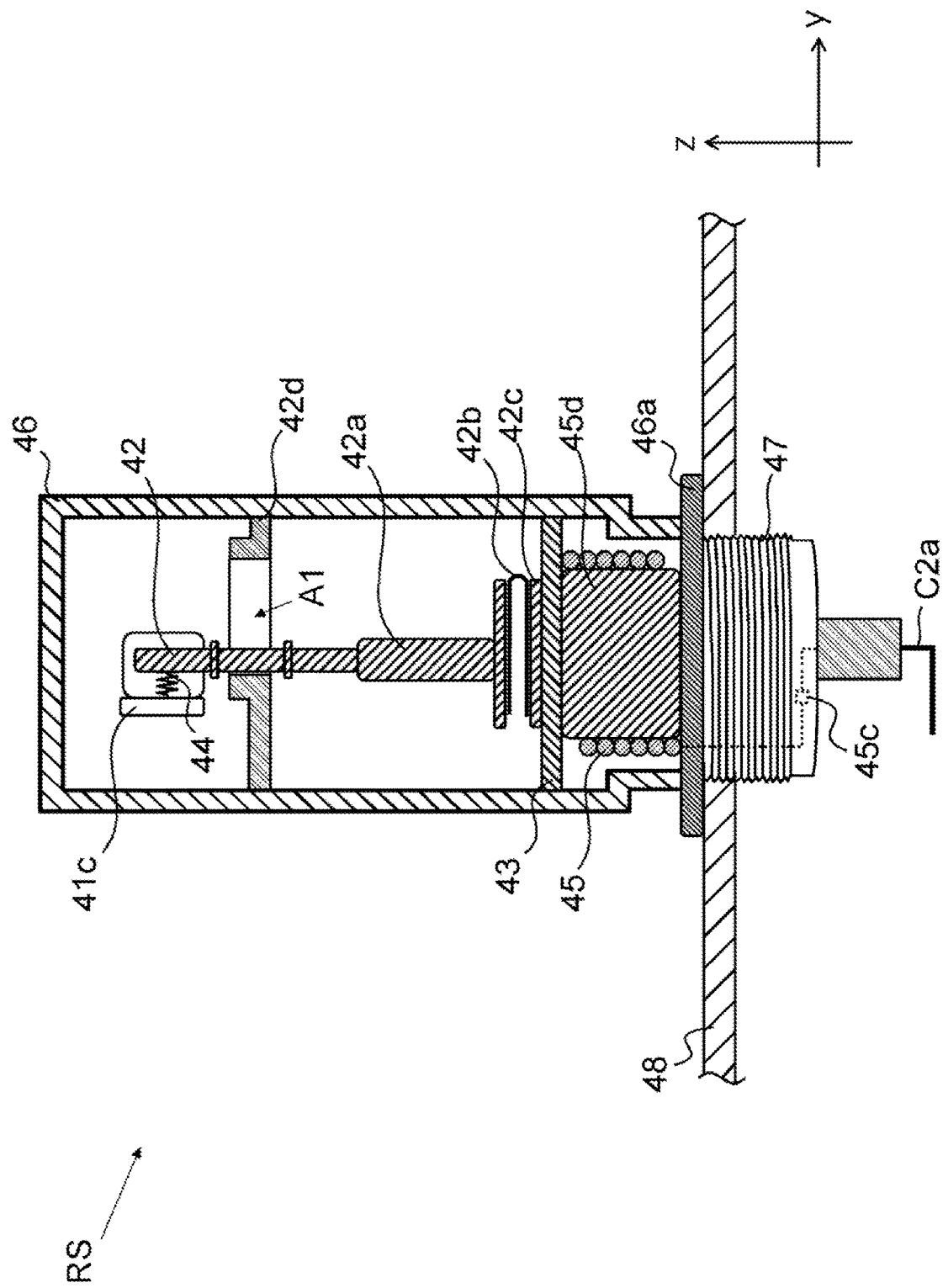

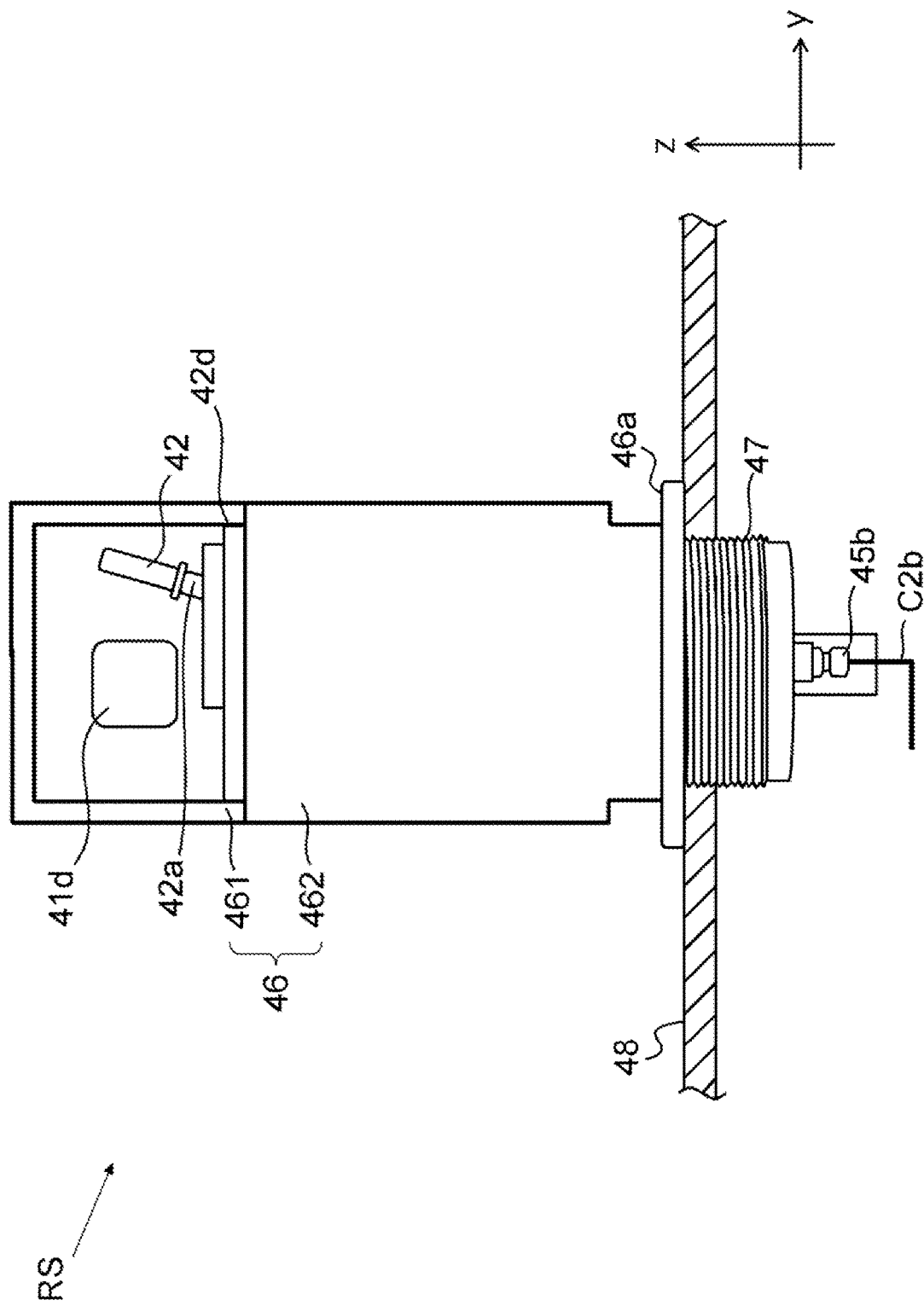

RELAY, APPARATUS INCLUDING RELAY, AND LOAD TESTING APPARATUS INCLUDING RELAY

TECHNICAL FIELD

The present invention relates to a relay and the like.

BACKGROUND ART

Conventionally, a relay used for on/off control of power supply to an electric member has been proposed as in Patent Literature 1.

CITATION LIST

Patent Literature

Patent Literature 1: JP 2010-025752 A

SUMMARY OF INVENTION

Technical Problem

However, a relay in which on/off control is frequently performed is likely to cause a failure.

Therefore, an object of the present invention is to provide a relay and the like that can easily prevent the occurrence of a failure.

Solution to Problem

A relay according to the present invention includes a fixed contact, a movable contact, a return member of the movable contact, and a case that covers the fixed contact, the movable contact, and the return member. The case is made of a material having transparency or translucency.

When the case is made of a transparent material or a material having translucency, the operating state of the movable contact and the like can be visually recognized from the outside of the case.

By visually recognizing the internal state of the case, it becomes easy to prevent a failure of the relay, such as a determination becomes easy whether or not to replace one with a new relay.

Preferably, the relay further includes a tray portion that is disposed above the return member and below the fixed contact and holds a fusing residue generated by separation/approach of the movable contact from/to the fixed contact.

When the fixed contact and the movable contact come into contact with each other or are separated from each other, a fusing residue or the like at the time of arcing may fall downward.

There is a possibility that the fusing residue may interfere with the operation of the lower member, and the operation of separation and approach of the movable contact from and to the fixed contact may not be able to be normally performed.

The tray portion receives the fusing residue or the like and prevents the fusing residue from falling downward. Therefore, the normal operation of separation and approach of the movable contact from and to the fixed contact can be easily maintained.

More preferably, the relay further includes a cap that covers a portion of a terminal connected to the fixed contact, the portion being exposed from the case. When the cap is attached to the case, at least a portion of the case is exposed without being covered by the cap.

By covering the terminal with the cap, the exposed metal portion of the terminal is hidden, and the possibility of the occurrence of a short circuit between terminals can be reduced.

Preferably, a lower portion of the case is mounted on a horizontal surface such that the fixed contact is positioned above the return member.

The relay is mounted on the horizontal surface of a fixing portion such that the fixed contact and the movable contact are positioned above.

This makes it possible to cause the movable contact to perform a predetermined operation and stop the movable contact at a predetermined position, in a state where the movable contact is hardly affected by gravity.

Preferably, an apparatus includes the relay, and the fixing portion including the horizontal surface is provided with a sensor unit including a vibration sensor that detects vibration inside the case.

Preferably, the case is provided with a sensor unit including at least one of a temperature sensor that detects a temperature of the case and a vibration sensor that detects vibration inside the case.

More preferably, the relay is in an open state in which the fixed contact and the movable contact are not in contact with each other when the relay is off, and the relay is in a closed state in which the fixed contact and the movable contact are in contact with each other when the relay is on. A diode is electrically connected to an end of a coil of a drive member that moves the movable contact.

As a result, the direction of current flowing through the coil of the drive member is made constant, poles of an electromagnet are made constant, and the force of bringing the return member close by the electromagnet can be prevented from changing.

In addition, when the direction of the current flowing through the coil of the drive member is incorrect due to a wiring error, it is possible to prevent the movable contact from operating to come into contact with the fixed contact.

More preferably, one of the fixed contact and the movable contact is provided with an impact absorbing portion including a conductive elastic member. The fixed contact and the movable contact are electrically connected to each other via the impact absorbing portion.

The expansion and contraction of the elastic member of the impact absorbing portion makes it possible to absorb an impact when the fixed contact and the movable contact come into contact with each other.

In addition, the fixed contact and the movable contact can maintain a contact state (maintain a closed state) more firmly.

Preferably, a yoke is provided on at least one of the inside and the outside of the coil of the drive member that moves the movable contact.

Thus, the attraction force of the drive member can be improved.

More preferably, a load testing apparatus includes a resistor and the relay according to the present invention, and the relay is used for on/off control of power supply to the resistor.

Advantageous Effects of Invention

As described above, according to the present invention, it is possible to provide a relay and the like that can easily prevent the occurrence of a failure.

BRIEF DESCRIPTION OF DRAWINGS

FIG. 22 is a schematic diagram illustrating a configuration of an operation unit including an emergency stop switch.

FIG. 23 is a cross-sectional view of a relay that is provided with an impact absorbing portion and is in an off state as viewed from the right side.

FIG. 24 is a cross-sectional view of the relay that is provided with the impact absorbing portion and is in an on state as viewed from the right side.

FIG. 25 is a right side view of the relay that is in an off state and includes a case in which a first region is made of a transparent material.

DESCRIPTION OF EMBODIMENTS

Figure 1:
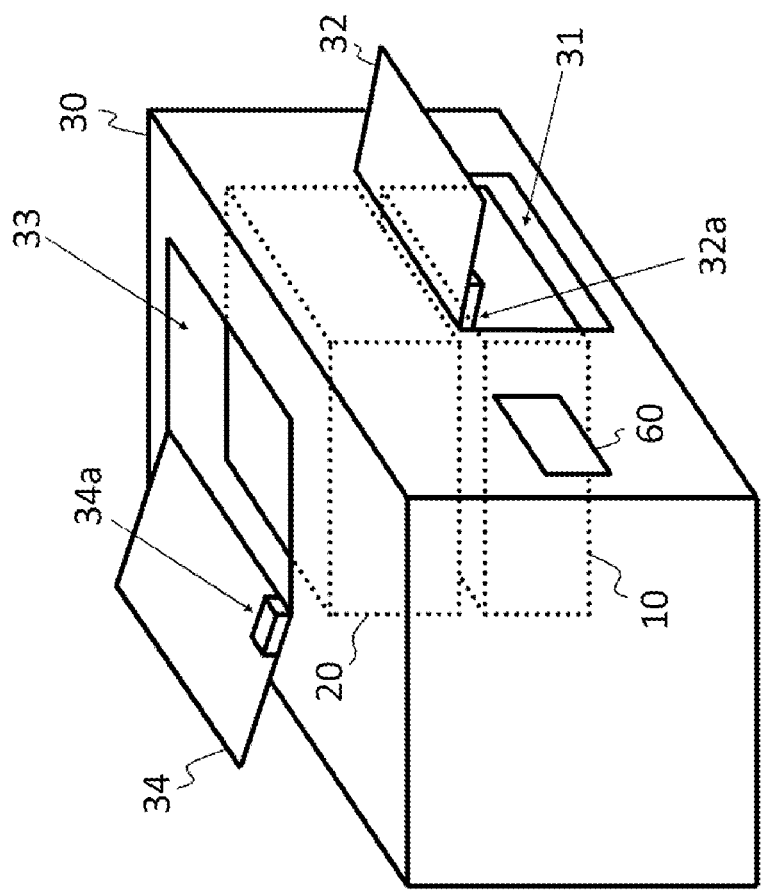
FIG. 1 is a perspective view illustrating a configuration of a load testing apparatus according to the present embodiment.
Figure 2:
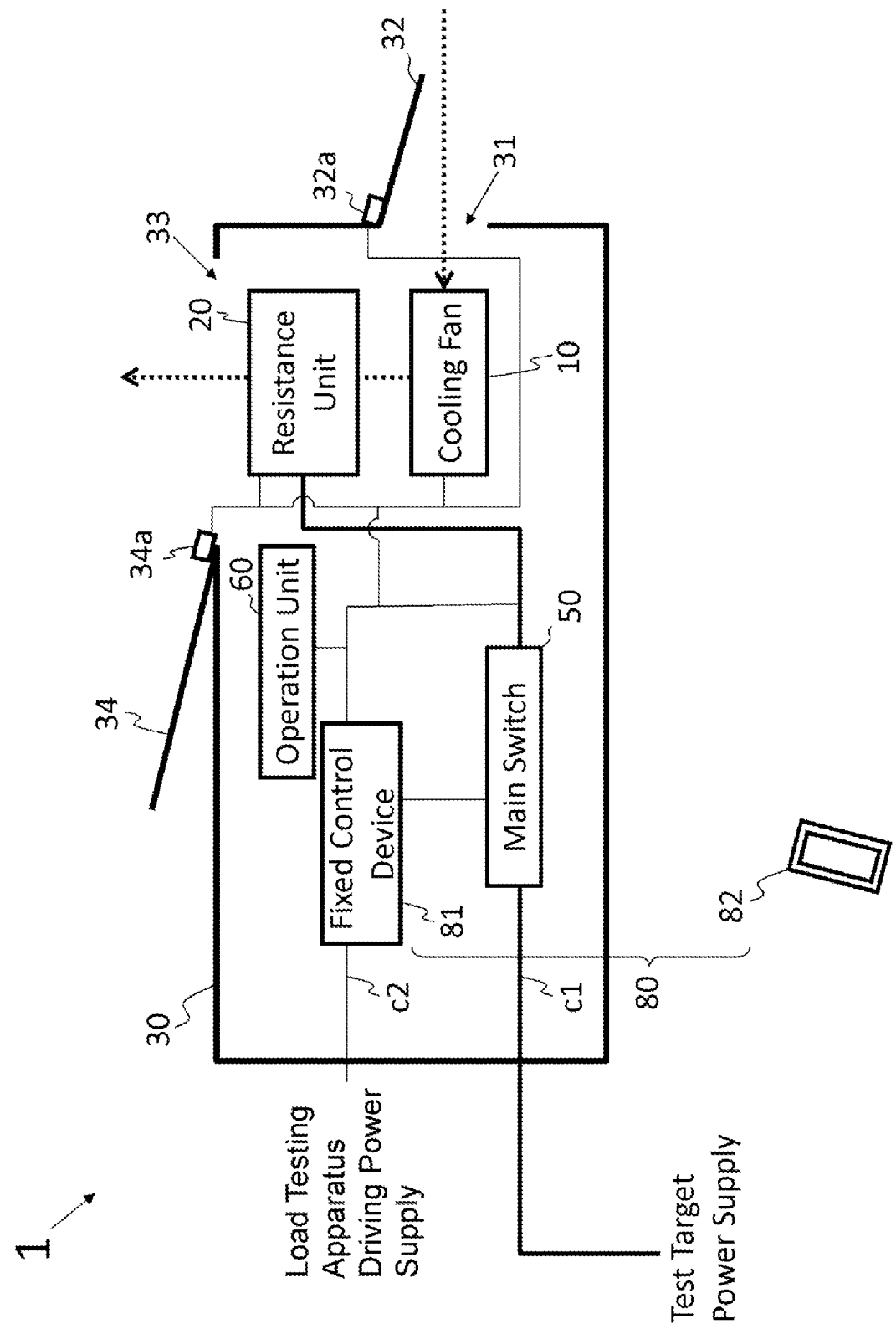
FIG. 2 is a schematic diagram illustrating a configuration of the load testing apparatus.
Figure 3:
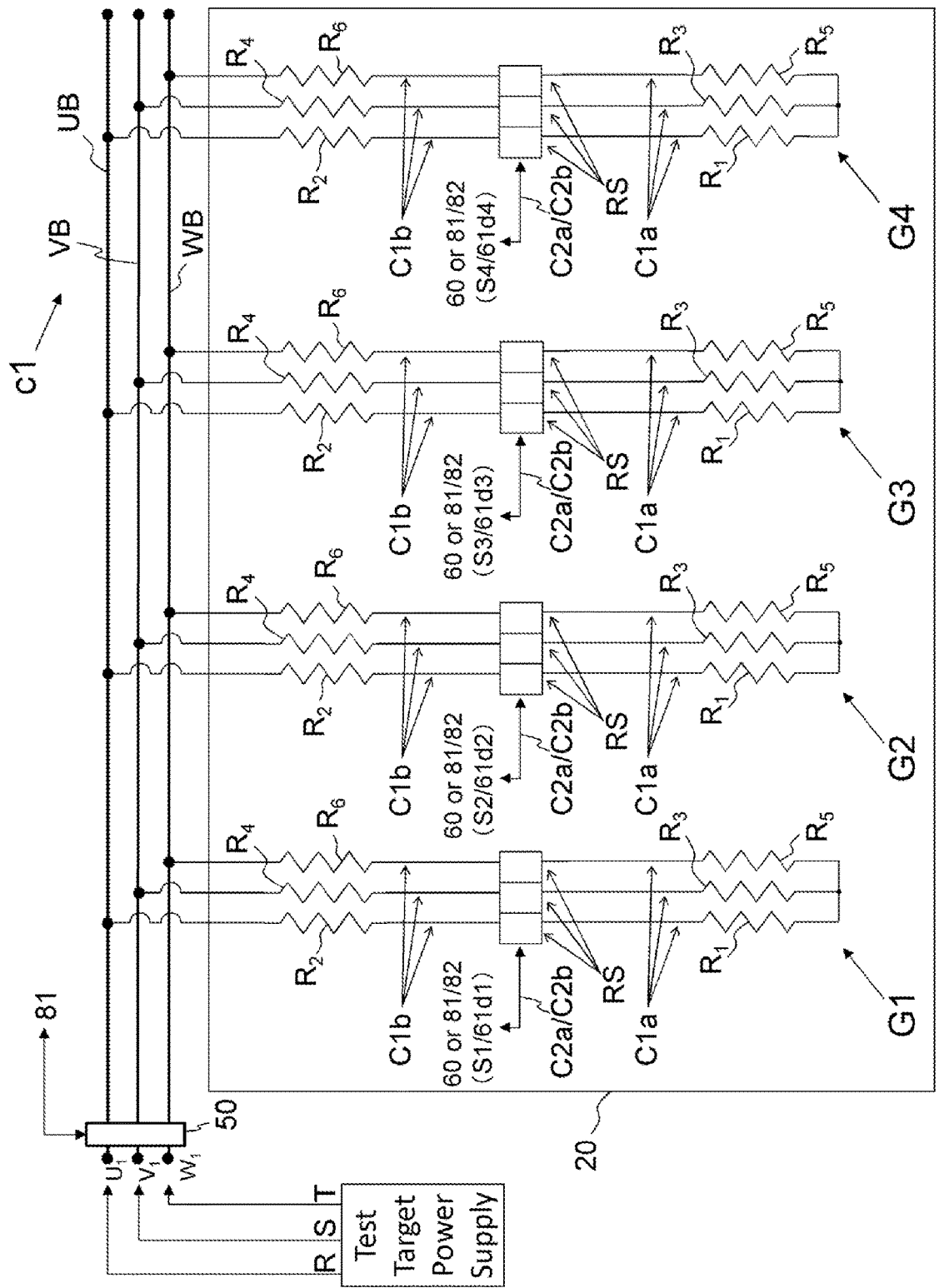
FIG. 3 is a schematic diagram illustrating a circuit configuration of a resistance unit.

Hereinafter, the present embodiment will be described with reference to the drawings.

Note that the embodiment is not limited to the following embodiment. In addition, the contents described in one embodiment are similarly applied to other embodiments in principle. Further, each embodiment and each modification can be appropriately combined.

A load testing apparatus 1 includes a cooling fan 10, a resistance unit 20, a housing 30, a main switch 50, an operation unit 60, and a control unit 80, and is used to perform a load test of a power supply device (test target power supply) such as a generator (see FIGS. 1 to 22).

(Cooling Fan 10)

The cooling fan 10 is a device that sends cooling air to the resistance unit 20, and the resistance unit 20 is disposed above the cooling fan 10.

(Resistance Unit 20)

The resistance unit 20 is provided with one or more resistor groups. A plurality of resistors constituting each resistor group are formed in a rod shape extending in the horizontal direction, are arranged at predetermined intervals, and are connected in series or in parallel with each other. During the load test, power from the test target power supply is supplied to a part or all of the resistor groups.

Each of the resistors is not limited to one formed of an electric heating wire, and may be one capable of storing electric power inside, such as a battery.

The present embodiment shows an example in which four resistor groups including two resistor groups (first resistor group G1 and second resistor group G2) each having a rated capacity of 5 kW and two resistor groups (third resistor group G3 and fourth resistor group G4) each having a rated capacity of 10 kW are provided for a load test of a three-phase AC power supply.

Each resistor group is provided with two resistors (first resistor $R_1$ and second resistor $R_2$) connected in series for the U phase connected to the R-phase terminal of the test target power supply, two resistors (third resistor $R_3$ and fourth resistor $R_4$) connected in series for the V phase connected to the S-phase terminal of the test target power supply, and two resistors (fifth resistor $R_5$ and sixth resistor $R_6$) connected in series for the W phase connected to the T-phase terminal of the test target power supply. Relays RS are provided between the first resistor $R_1$ and the second resistor $R_2$, between the third resistor $R_3$ and the fourth resistor $R_4$, and between the fifth resistor $R_5$ and the sixth resistor $R_6$.

The relays RS are controlled to be turned on and off in response to an on/off operation of first to fourth switches S1 to S4 to be described later. The relay RS causes current to flow through a resistor corresponding to the relay RS when the relay RS is in an on state.

The relays RS may be a triple switch in which a U-phase relay, a V-phase relay, and a W-phase relay are turned on and off in conjunction with each other, or may be a single switch in which each of the relays is turned on and off independently.

Details of the relays RS will be described later.

One terminal of the second resistor $R_2$ in each resistor group is connected to a U-phase line UB of a cable (test target power supply cable) c1 electrically connecting the test target power supply to the resistance unit 20. The U-phase line UB extends from a U-phase terminal $U_1$ connected to the R-phase terminal of the test target power supply.

One terminal of the fourth resistor $R_4$ in each resistor group is connected to a V-phase line VB of the test target power supply cable c1. The V-phase line VB extends from a V-phase terminal $V_1$ connected to the S-phase terminal of the test target power supply.

One terminal of the sixth resistor $R_6$ in each resistor group is connected to a W-phase line WB of the test target power supply cable c1. The W-phase line WB extends from a W-phase terminal $W_1$ connected to the T-phase terminal of the test target power supply.

One terminal of the first resistor $R_1$, one terminal of the third resistor $R_3$, and one terminal of the fifth resistor $R_5$ in each resistor group are short-circuited.

However, the number of resistor groups, the rated voltage of each of the resistor groups, the rated capacity of each of the resistor groups, the wirings of the resistors, and the wiring of the relays are not limited to the above-described configurations.

(Housing 30)

The housing 30 holds members included in the load testing apparatus 1, such as the cooling fan 10, the resistance unit 20, the main switch 50, the operation unit 60, and a fixed control device 81 of the control unit 80, except for a mobile terminal including a mobile control device 82. In the housing 30, an intake port 31 is provided in a side surface (upstream) below the cooling fan 10, and an exhaust port 33 is provided above (downstream) the resistance unit 20.

The intake port 31 is provided with an intake cover 32 that opens when in use and closes when not in use. The exhaust port 33 is provided with an exhaust cover 34 that opens when in use and closes when not in use.

The intake cover 32 opens and closes via a first actuator 32a that operates in conjunction with the on/off operation of the operation unit 60. The intake cover 32 may not automatically open and close using the first actuator 32a, and may be opened and closed manually.

The exhaust cover 34 opens and closes via a second actuator 34a that operates in conjunction with the on/off operation of the operation unit 60. The exhaust cover 34 may not automatically open and close using the second actuator 34a, and may be opened and closed manually.

In the present embodiment, a mode in which both the intake cover 32 and the exhaust cover 34 are constituted by hinged doors will be described, but a mode in which both the intake cover 32 and the exhaust cover 34 are constituted by other door structures such as sliding doors may be used.

In the present embodiment, a mode in which the cooling fan 10 is disposed below, the resistance unit 20 is disposed above, and cooling air flows from the lower side to the upper side will be described.

However, the cooling fan 10 and the resistance unit 20 may be arranged in the horizontal direction, and cooling air may flow in the horizontal direction.

In this case, the upper surface of the resistance unit 20 may be used as a fixing portion 48 to be described later, and the relays RS may be disposed on the upper surface of the resistance unit 20.

(Relays RS)

The relay RS includes a fixed contact 41, a movable contact 42, a return member 42b, a tray portion 42d, a partition wall 43, a drive member 45, a diode 45c, a yoke 45d, a case 46, an attachment portion 47, a cap 49, and the like (see FIGS. 4 to 17).

The relay RS is desirably of a make contact type in which the relay RS is in an open state in which the fixed contact 41 and the movable contact 42 are not in contact with each other when the relay RS is off, and the relay RS is in a closed state in which the fixed contact 41 and the movable contact 42 are in contact with each other when the relay RS is on.

The fixed contact 41 is made of a conductive member.

A terminal (first terminal 41a) protruding from one end of the fixed contact 41 of the U-phase relay RS to the outside of the case 46 is connected to the other terminal of the first resistor $R_1$. A terminal (second terminal 41b) protruding from the other end of the fixed contact 41 of the U-phase relay RS to the outside of the case 46 is connected to the other terminal of the second resistor $R_2$.

A terminal (first terminal 41a) protruding from one end of the fixed contact 41 of the V-phase relay RS to the outside of the case 46 is connected to the other terminal of the third resistor $R_3$. A terminal (second terminal 41b) protruding from the other end of the fixed contact 41 of the V-phase relay RS to the outside of the case 46 is connected to the other terminal of the fourth resistor $R_4$.

A terminal (first terminal 41a) protruding from one end of the fixed contact 41 of the W-phase relay RS to the outside of the case 46 is connected to the other terminal of the fifth resistor $R_5$. A terminal (second terminal 41b) protruding from the other end of the fixed contact 41 of the W-phase relay RS to the outside of the case 46 is connected to the other terminal of the sixth resistor $R_6$.

A power cable provided between the other terminal of the first resistor $R_1$ and the first terminal 41a of the relay RS, between the other terminal of the third resistor $R_3$ and the first terminal 41a of the relay RS, and between the other terminal of the fifth resistor $R_5$ and the first terminal 41a of the relay RS is defined as a first power cable C1a.

A power cable provided between the other terminal of the second resistor $R_2$ and the second terminal 41b of the relay RS, between the other terminal of the fourth resistor $R_4$ and the second terminal 41b of the relay RS, and between the other terminal of the sixth resistor $R_6$ and the second terminal 41b of the relay RS is defined as a second power cable C1b.

One end of the fixed contact 41 is defined as a fixed contact 41c on the first terminal 41a side.

The other end of the fixed contact 41 is defined as a fixed contact 41d on the second terminal 41b side.

In order to describe directions of the relay RS, a horizontal direction (left-right direction) is defined as an x direction, a horizontal direction (front-rear direction) perpendicular to the x direction is defined as a y direction, and a direction (up-down direction) perpendicular to the x direction and the y direction is defined as a z direction.

Figure 4:
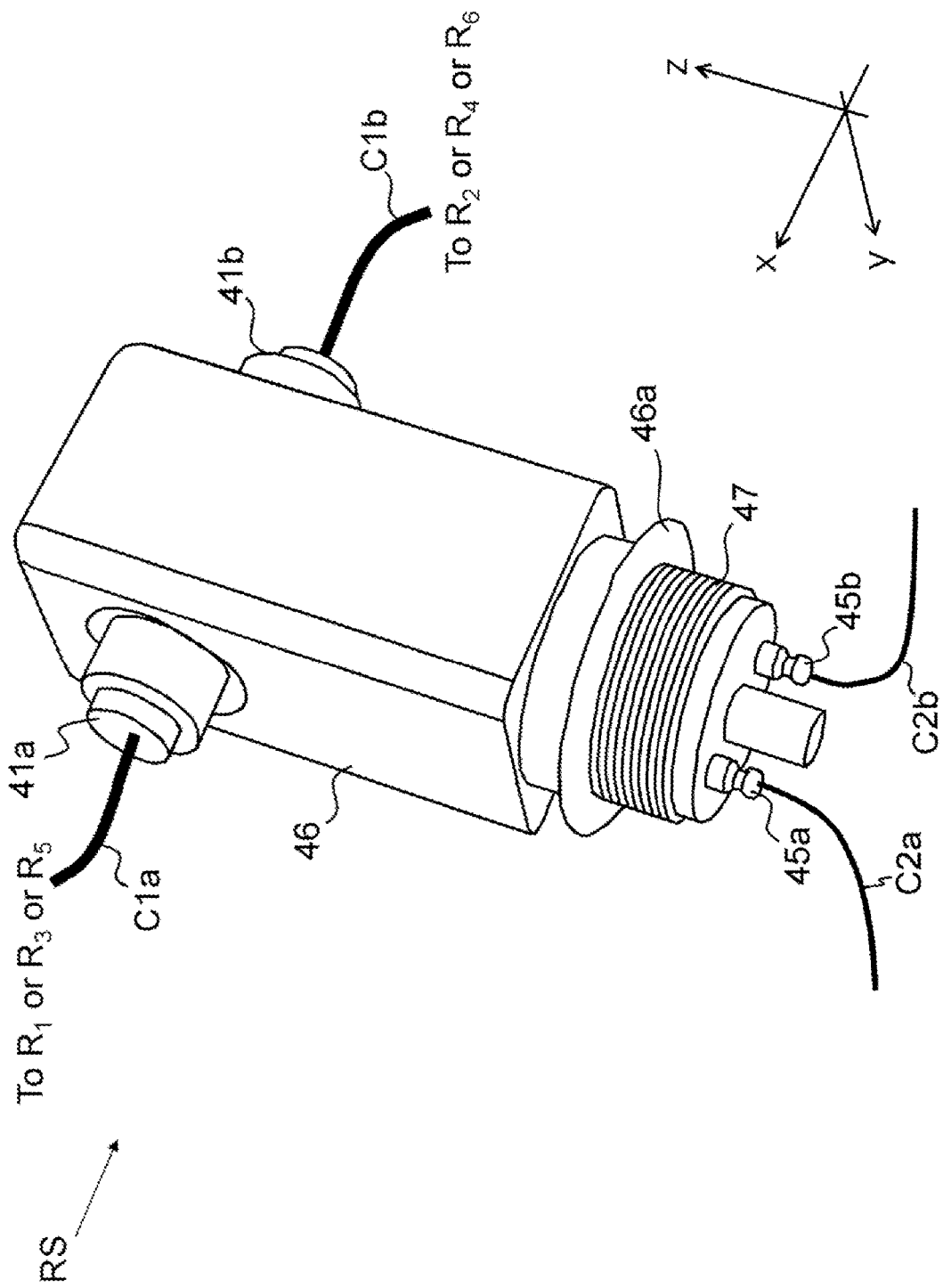
FIG. 4 is a perspective view of a relay as viewed from below.
Figure 5:
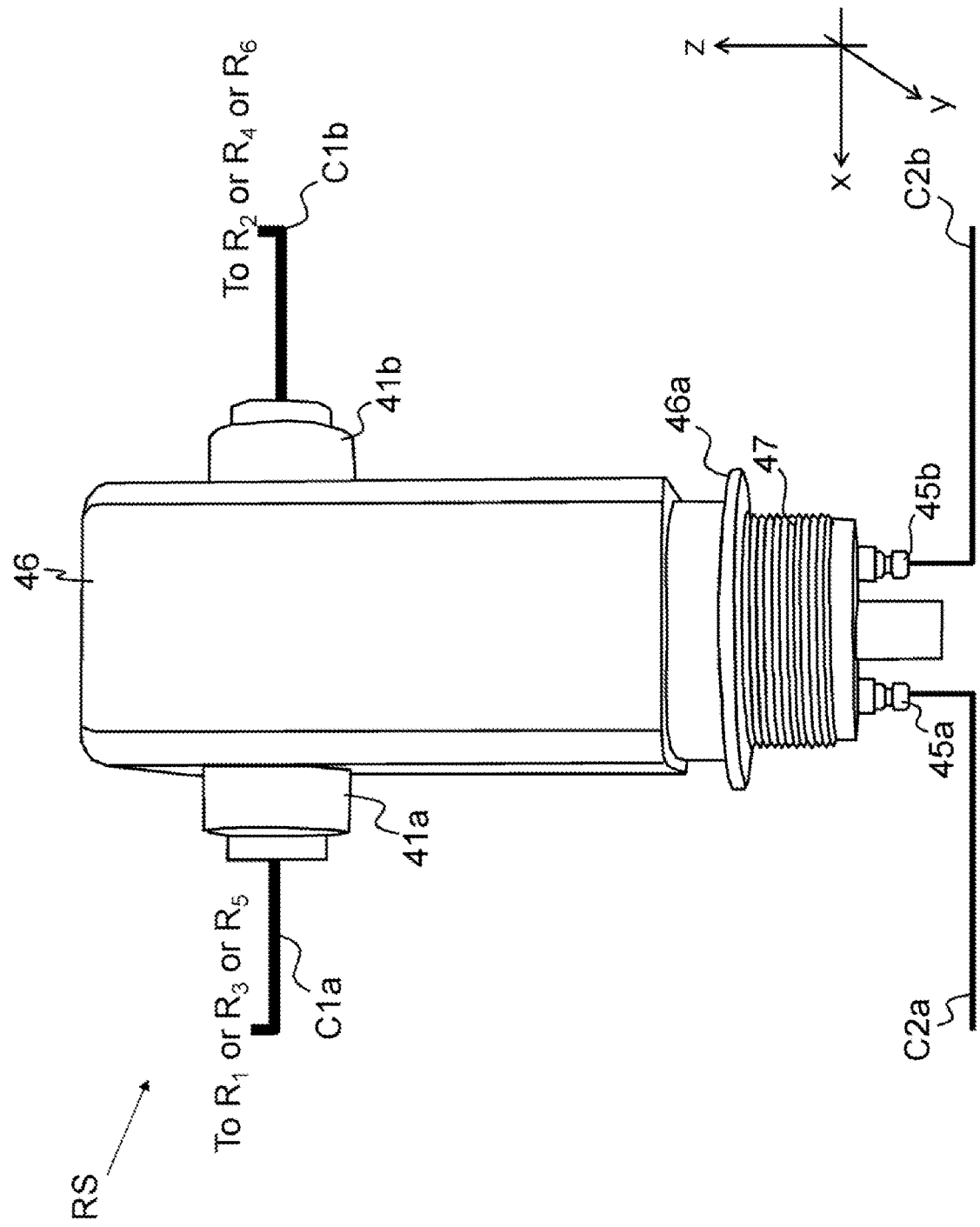
FIG. 5 is a perspective view of the relay as viewed from the rear.
Figure 6:
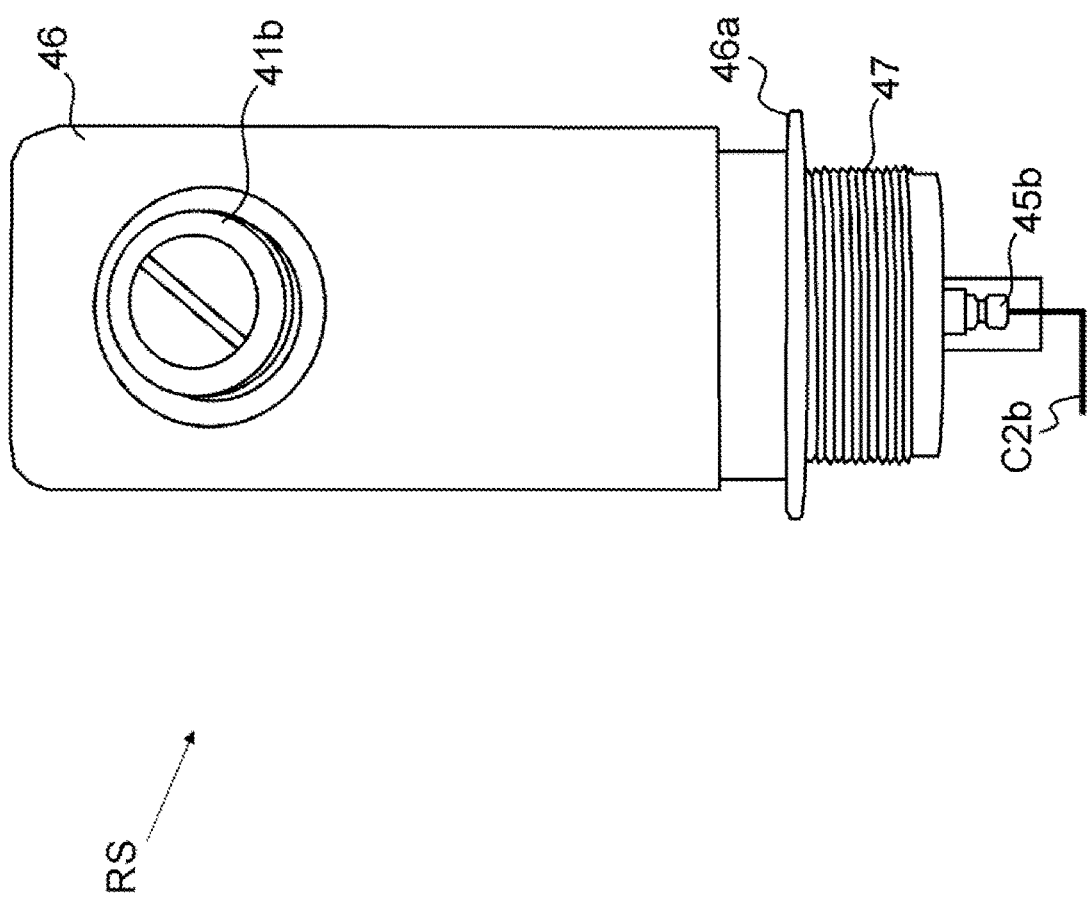
FIG. 6 is a right side view of the relay.

In FIG. 4, directions indicated by arrows of xyz axes are defined as a left direction, a front direction, and an upper direction, respectively.

The first terminal 41a is disposed on the left side in the x direction of the case 46. The second terminal 41b is disposed on the right side in the x direction of the case 46.

(Movable Contact 42)

The movable contact 42 is driven by the drive member 45 including a coil. By said driving, switching is performed between an on state in which the movable contact 42 and the fixed contact 41 are in contact with each other and an off state in which the movable contact 42 and the fixed contact 41 are not in contact with each other.

The movable contact 42 is made of a conductive member and is held by a movable contact holding portion 42a.

The movable contact holding portion 42a is made of a non-conductive member (insulating member), and is held by the return member 42b.

The return member 42b is held by a base portion 42c.

(Return Member 42 b)

The return member 42b includes a return spring such as a leaf spring or a coil spring, and is urged in an opening direction.

By the urging force of the return member 42b, the movable contact holding portion 42a and the movable contact 42 are positioned in an inclined state in a direction away from the fixed contact 41.

At least one of a portion of the movable contact holding portion 42a at least in contact with the return member 42b and a portion of the return member 42b at least in contact with the movable contact holding portion 42a is made of a magnetic material that is magnetically attached to a magnet.

When current flows through the coil of the drive member 45, the return member 42b is closed by magnetic force, and the movable contact 42 is in contact with the fixed contact 41 while the movable contact holding portion 42a and the movable contact 42 being an upright state.

Figure 7:
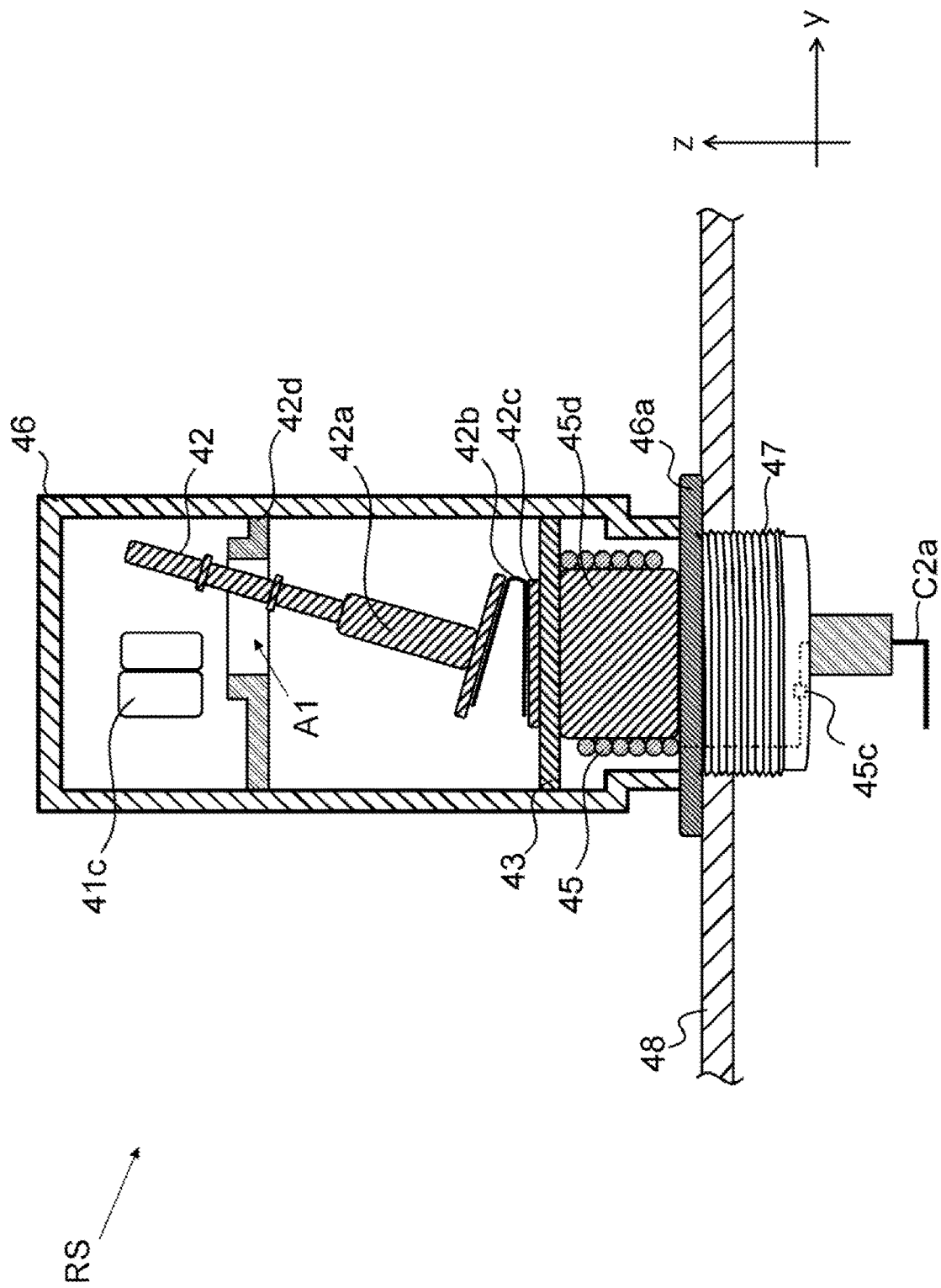
FIG. 7 is a cross-sectional view of the relay in an off state as viewed from the right side.
Figure 8:
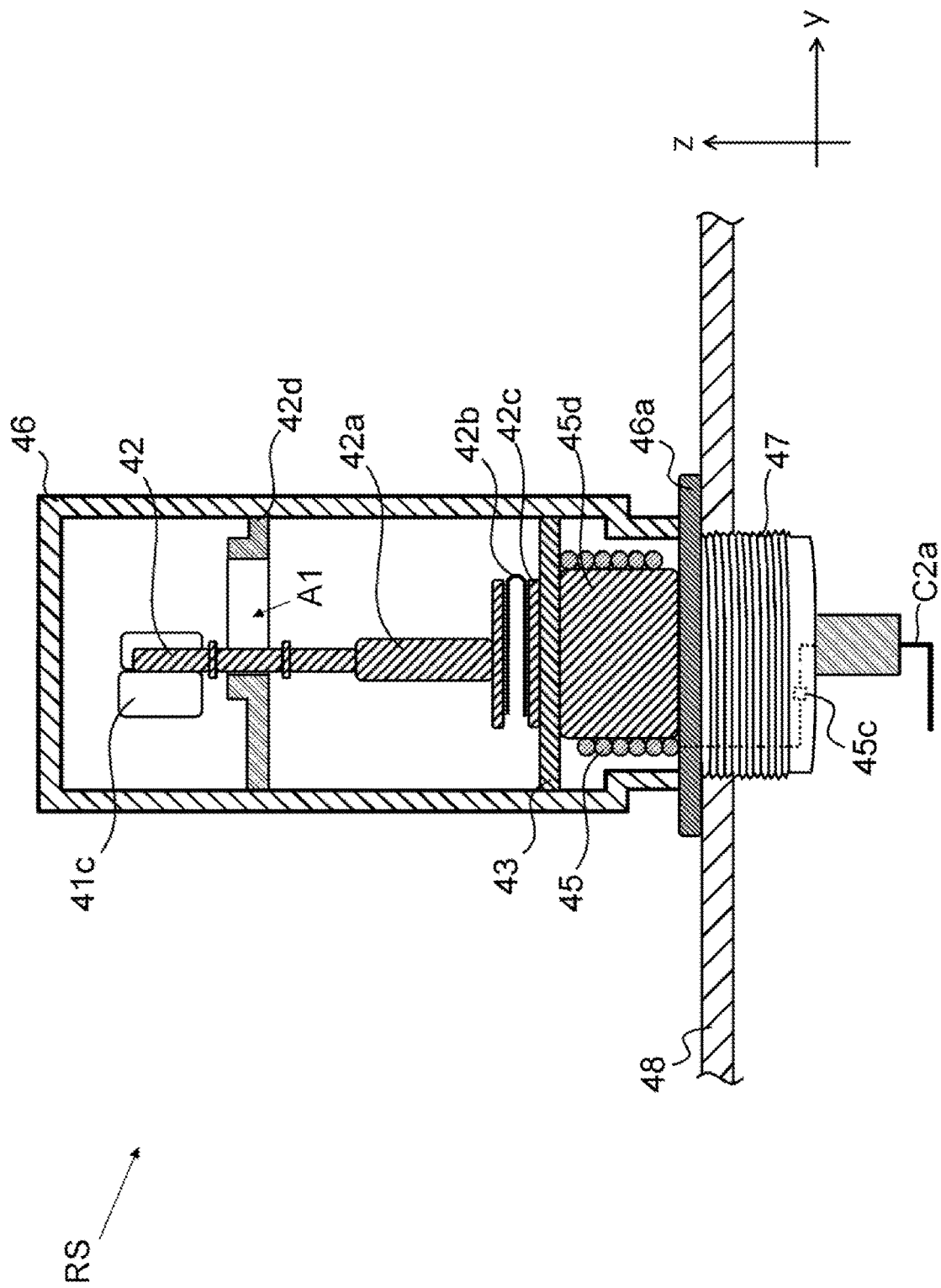
FIG. 8 is a cross-sectional view of the relay in an on state as viewed from the right side.
Figure 9:
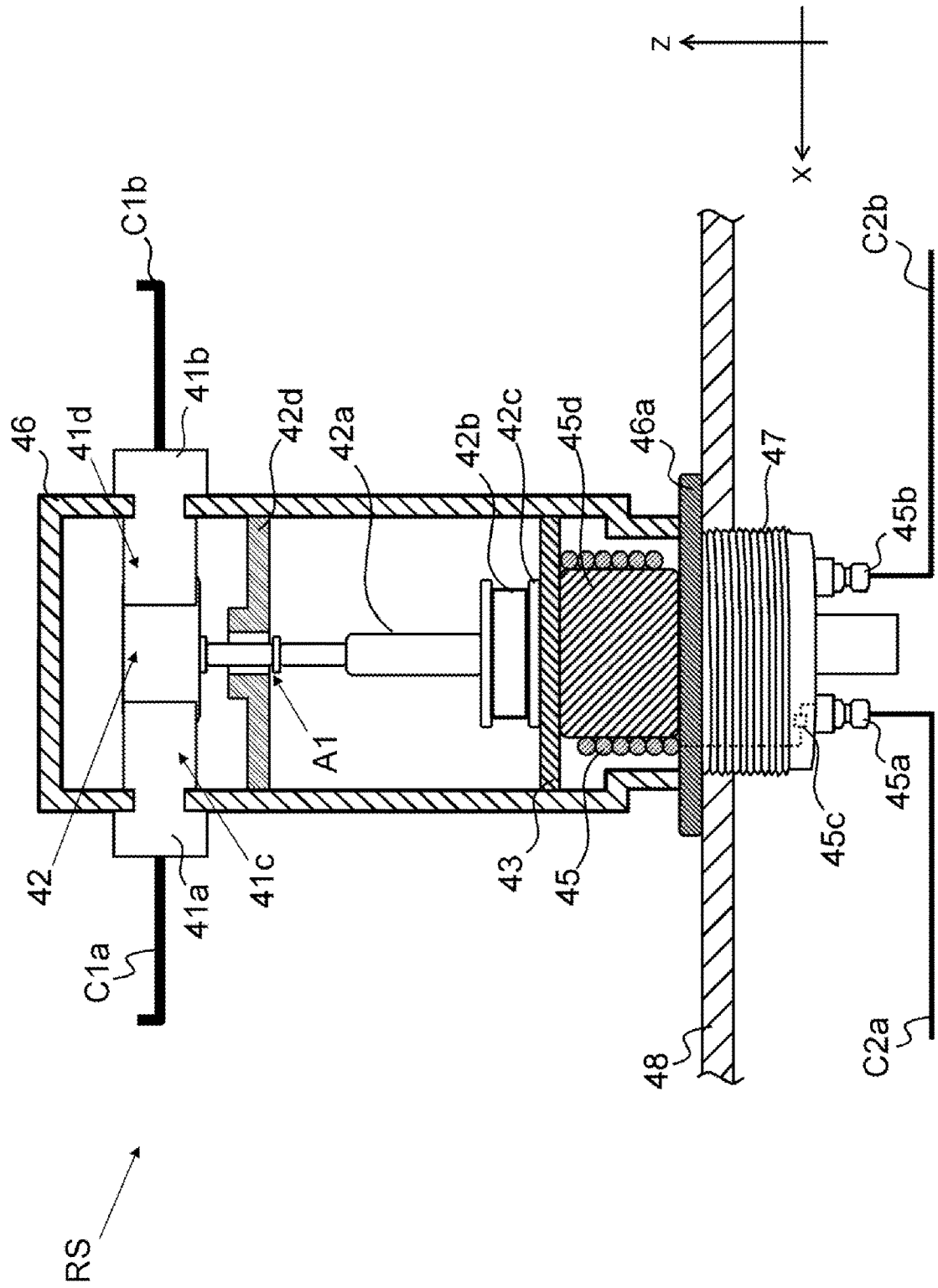
FIG. 9 is a cross-sectional view of the relay in the off state as viewed from the rear.
Figure 10:
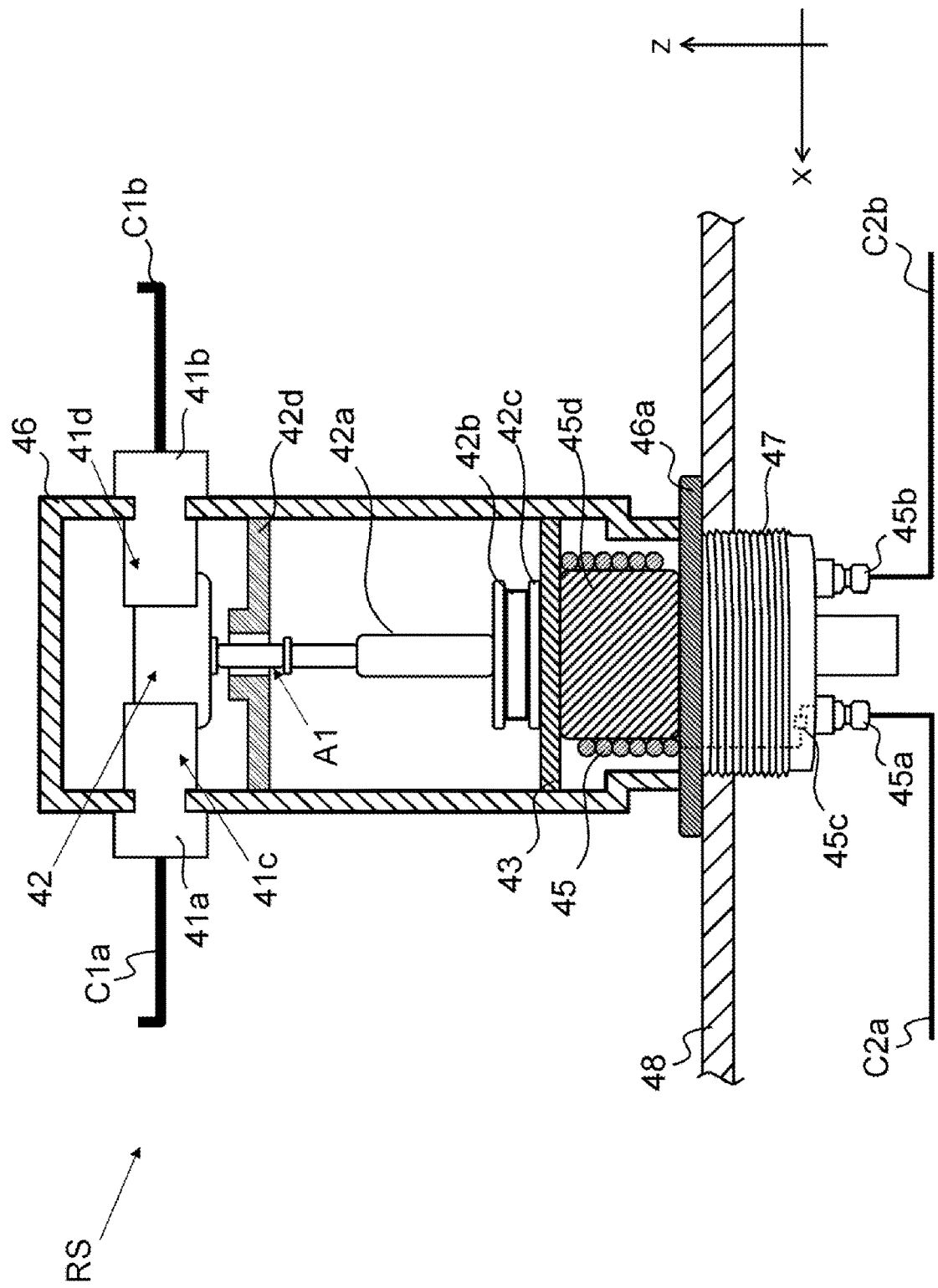
FIG. 10 is a cross-sectional view of the relay in the on state as viewed from the rear.
Figure 11:
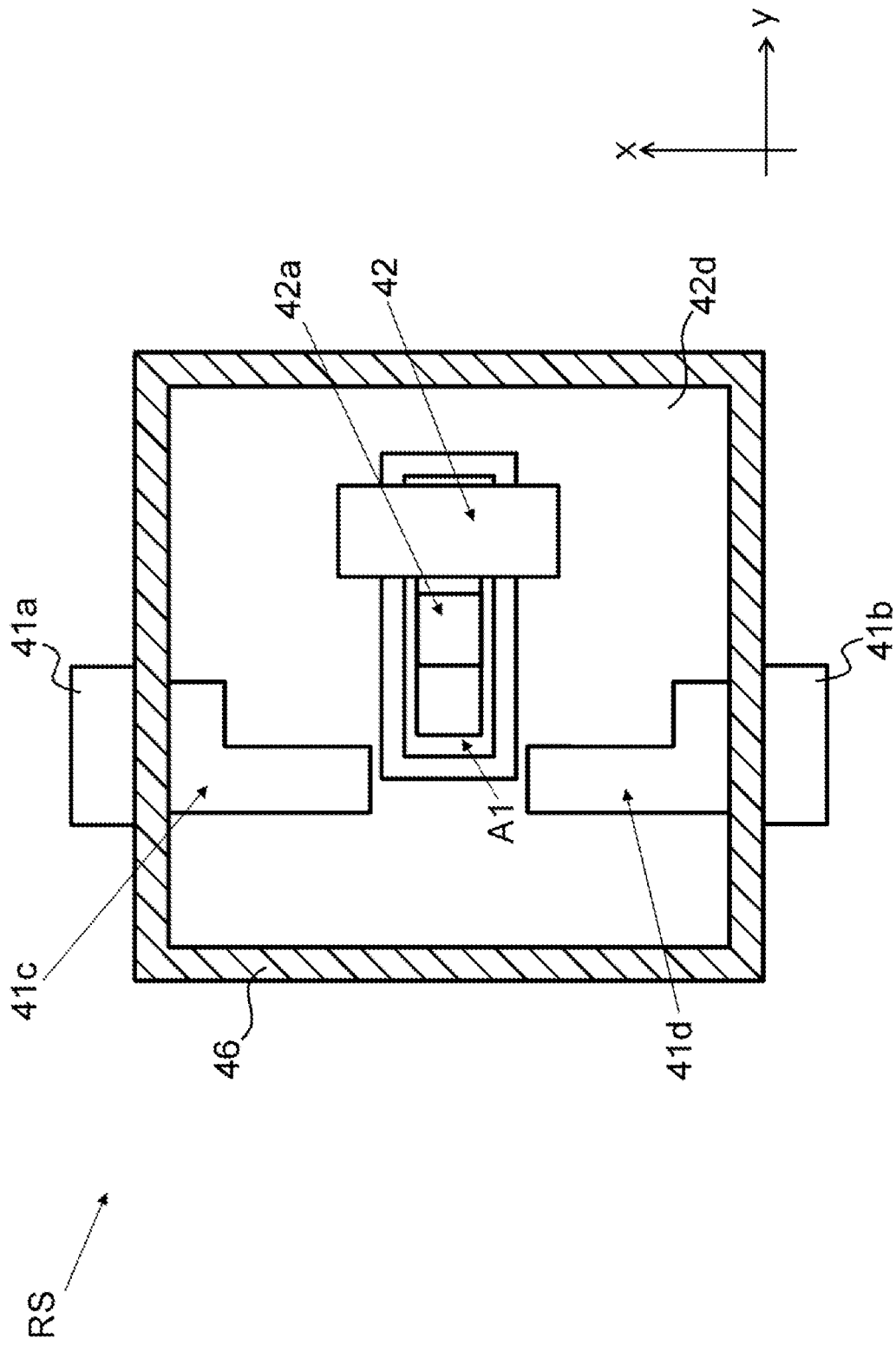
FIG. 11 is a cross-sectional view of the relay in the off state as viewed from above.
Figure 12:
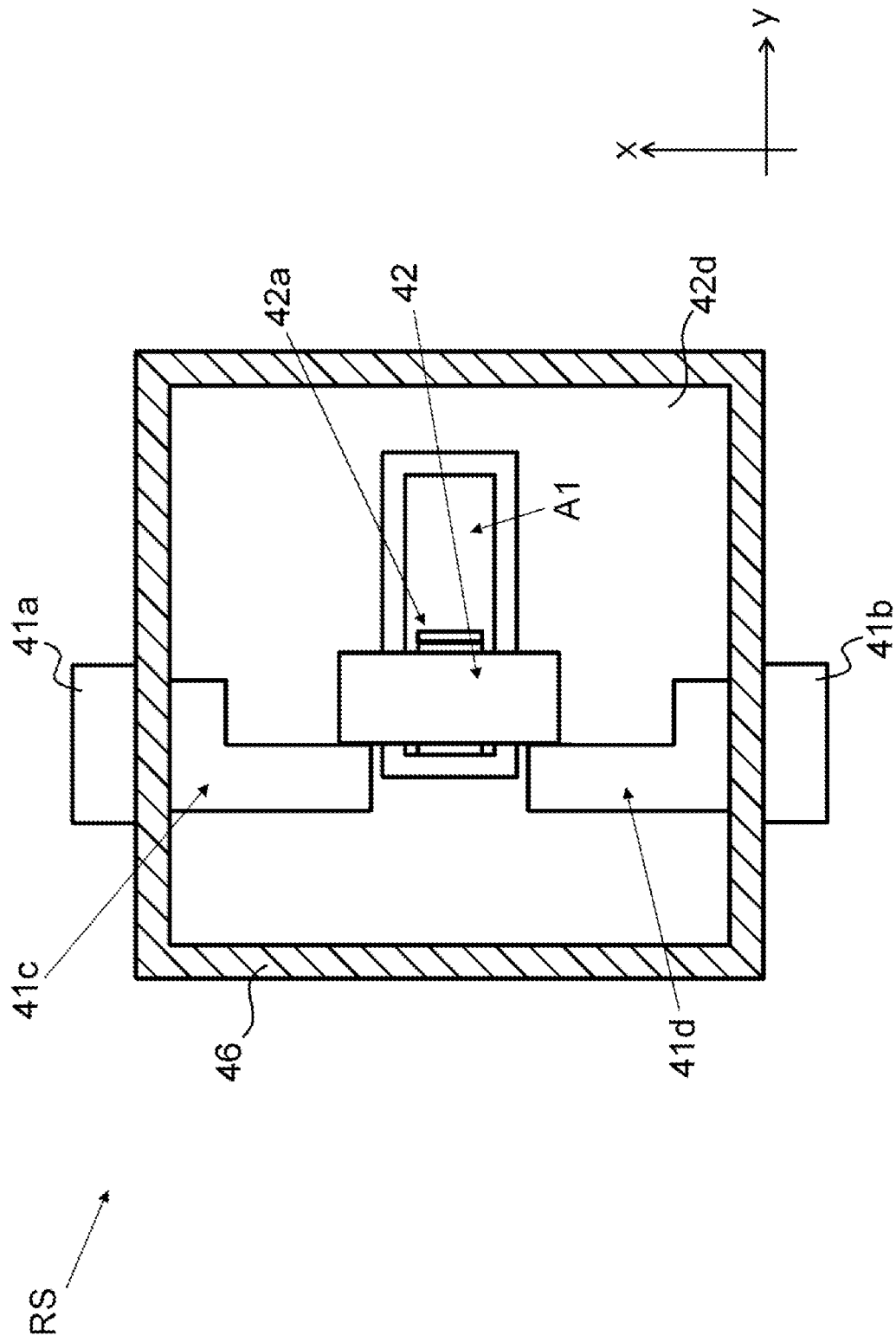
FIG. 12 is a cross-sectional view of the relay in the on state as viewed from above.

The movable contact holding portion 42a moves such that a rod-shaped portion of the movable contact holding portion 42a changes between a state where the rod-shaped portion is not parallel to the z direction but is inclined obliquely (see FIG. 7) and a state where the rod-shaped portion is substantially parallel to the z direction (see FIG. 8).

That is, the movable contact 42 and the movable contact holding portion 42a move such that an angle formed by the rod-shaped portion of the movable contact holding portion 42a and the xz plane changes.

(Tray Portion 42d)

The movable contact 42 is disposed above the return member 42b in the z direction.

The tray portion 42d is provided inside the case 46, below the movable contact 42 in the z direction, and above the return member 42b in the z direction.

The tray portion 42d receives a fusing residue generated due to arcing at the time of separation/approach of the movable contact 42 from/to the fixed contact 41 such that the fusing residue does not fall downward in the z direction.

The tray portion 42d is attached to an inner wall or the like of the case 46.

The tray portion 42d shields a space above the tray portion 42d in the z direction and a space below the tray portion 42d in the z direction, except for a hole A1 provided in a region that physically interferes with a moving region of the movable contact holding portion 42a.

(Effect of Providing Tray Portion 42d)

When the fixed contact 41 and the movable contact 42 come into contact with each other or are separated from each other, a fusing residue or the like at the time of arcing may fall downward in the z direction.

When the fusing residue reaches the return member 42b or the drive member 45, the fusing residue may prevent the operation of these members, whereby the operation of separation/approach of the movable contact 42 from/to the fixed contact 41 may not be able to be normally performed.

In the present embodiment, the tray portion 42d receives the fusing residue or the like and prevents the fusing residue from falling downward in the z direction. Therefore, the normal operation of separation/approach of the movable contact 42 from/to the fixed contact 41 can be easily maintained.

(Partition Wall 43)

The partition wall 43 is made of a non-magnetic material such as resin, and is provided between a member (base portion 42c) at the lower end in the z direction of the movable contact 42 and the upper end in the z direction of the drive member 45.

The base portion 42c may be omitted, and the return member 42b may be directly attached to the partition wall 43.

The partition wall 43 may be omitted.

(Drive Member 45)

The drive member 45 is formed of an electromagnet including a coil, and moves the movable contact 42 by magnetic force.

The drive member 45 is connected to the fixed control device 81 of the control unit 80 via a lead wire (first control cable C2a and second control cable C2b).

The drive member 45 receives power supplied via the lead wire (first control cable C2a and second control cable C2b).

The drive member 45 is subjected to operation control (switching control between the on state and the off state) by the fixed control device 81. However, the drive member 45 may be connected to the operation unit 60 via the lead wire (first control cable C2a and second control cable C2b).

The first control cable C2a is connected to a third terminal 45a extending from one end of the coil of the drive member 45.

The second control cable C2b is connected to a fourth terminal 45b extending from the other end of the coil of the drive member 45.

It is desirable that a diode 45c be provided between the one end of the coil of the drive member 45 and the third terminal 45a and/or between the other end of the coil and the fourth terminal 45b, that is, the diode 45c be electrically connected to the end of the coil.

In the present embodiment, an example in which the diode 45c is provided between the one end of the coil of the drive member 45 and the third terminal 45a will be described (see FIG. 7 and the like).

(Effect of Providing Diode 45c)

As a result, the direction of the current flowing through the coil of the drive member 45 is made constant, the poles of the electromagnet are made constant, and the force of bringing the return member 42b close by the electromagnet can be prevented from changing.

In addition, in a case where the direction of the current flowing through the coil of the drive member 45 is incorrect due to a wiring error, it is possible to prevent the movable contact 42 from operating to come into contact with the fixed contact 41.

The yoke (yoke) 45d made of a magnetic material is desirably provided on at least one of the inside and the outside of the coil of the drive member 45 in order to improve the magnetic force.

In the present embodiment, an example in which the yoke 45d is provided inside the coil of the drive member 45 will be described.

(Effect of Providing Yoke 45d)

Consequently, the attraction force by the drive member 45 at a portion made of a magnetic material of at least one of a portion of the movable contact holding portion 42a at least in contact with the return member 42b and a portion of the return member 42b at least in contact with the movable contact holding portion 42a can be improved.

(Case 46 and Attachment Portion 47)

The case 46 is made of an insulating member such as ceramic, and has a substantially hollow cylindrical shape with a lower end opened in the z direction and an upper end closed in the z direction. In the present embodiment, as a specific example of the substantially hollow cylindrical shape, the case 46 has a substantially hollow quadrangular prism shape.

The fixed contact 41, the movable contact 42, the return member 42b, the tray portion 42d, the partition wall 43, and the drive member 45 are disposed inside the case 46.

A base 46a whose edge has a flange shape is provided below the case 46 in the z direction, and the attachment portion 47 is provided below the base 46a in the z direction.

The base 46a and the attachment portion 47 are integrally formed of metal or the like, and close the lower end of the case 46 in the z direction.

The base 46a and the case 46 are fixed by adhesion or welding.

A side surface of the attachment portion 47 is threaded.

The third terminal 45a and the fourth terminal 45b are provided on a lower surface of the attachment portion 47.

A space around a region where the fixed contact 41 and the movable contact 42 are in contact with each other, that is, a space surrounded by the case 46 and the partition wall 43 or a space surrounded by the case 46 and the base 46a or the attachment portion 47 is desirably filled with inert gas.

The inert gas is introduced from a hole (not illustrated) or the like provided at the lower end of the attachment portion 47 in the z direction, and said hole is sealed after the introduction of the inert gas.

The case 46 is desirably made of a transparent material or a material having translucency.

In this case, the term "transparent" refers to a property of the material that has an extremely high transmittance and through which light passes such that the other side of the material can be seen through the material.

Figure 13:
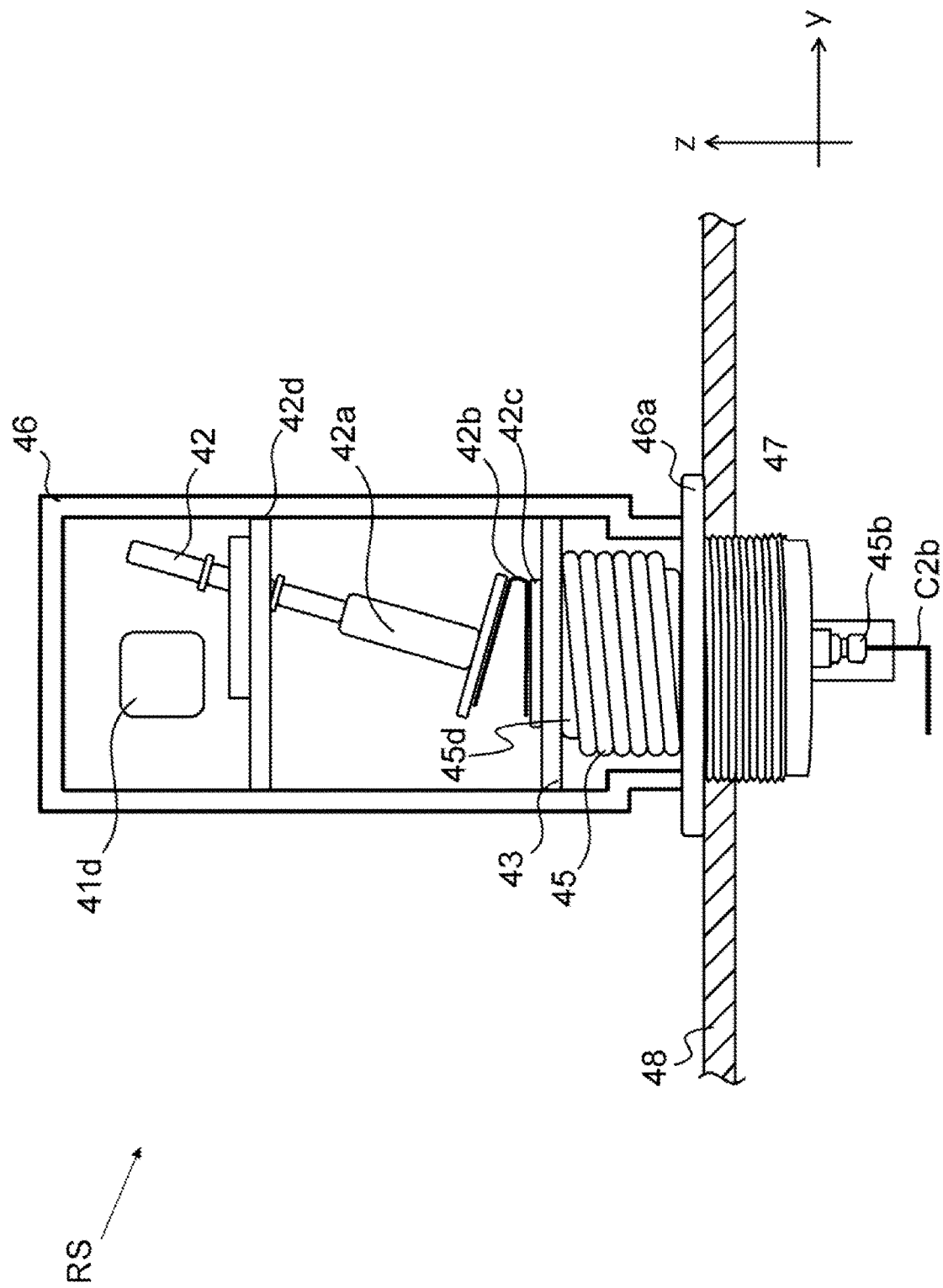
FIG. 13 is a right side view of a relay that uses a transparent case and is in an off state.
Figure 14:
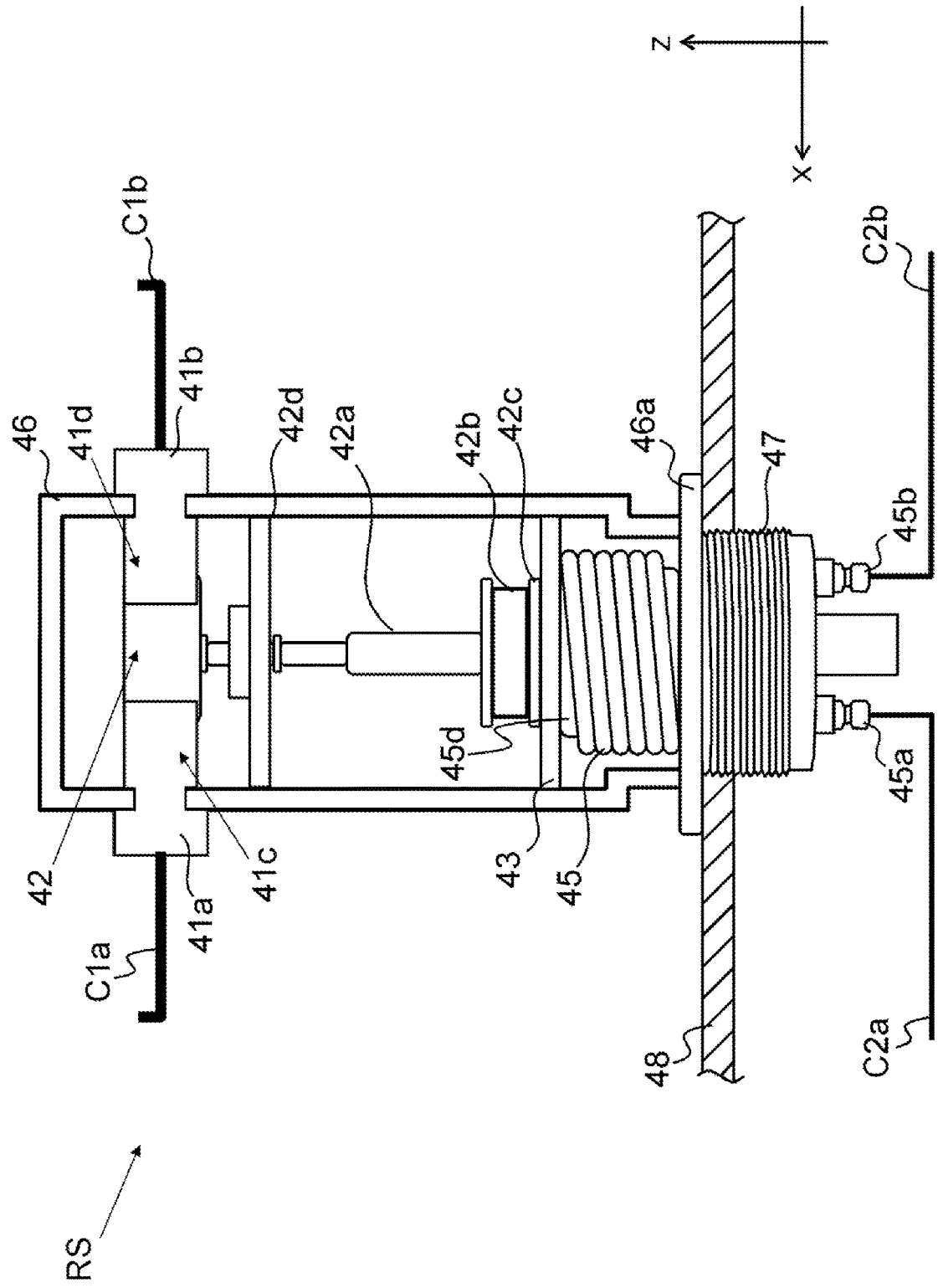
FIG. 14 is a rear view of the relay that uses the transparent case and in the off state.

Therefore, when the case 46 is made of a transparent material, as illustrated in FIGS. 13 and 14, the members provided inside the case 46, such as the movable contact 42, can be clearly seen from the outside of the case 46 through the case 46.

In FIG. 13, the terminal portion (second terminal 41b) on the side surface is omitted.

In addition, "having translucency" means a property of the material in which light is transmitted similarly to "transparent", but the transmitted light is diffused or the transmittance is low such that a shape or the like on the other side cannot be clearly recognized through the material unlike "transparent".

Therefore, in a case where the case 46 is made of a material having translucency, the members provided inside the case 46, such as the movable contact 42, can be seen through the case 46 from the outside of the case 46 although not as much as illustrated in FIGS. 13 and 14.

(Effect of Making Case 46 Transparent or the Like)

When the case 46 is made of a transparent material or a material having translucency, it is possible to visually recognize the operating state of the movable contact 42 and the amount of a fusing residue or the like accumulated above the tray portion 42d in the z direction from the outside of the case 46.

By visually recognizing the internal state of the case 46, it becomes easy to prevent a failure of the relay RS, such as a determination becomes easy whether or not to replace one with a new relay RS.

FIGS. 13 and 14 illustrate an example in which the entire case 46 is made of a transparent material or a material having translucency. However, a region (first region 461) that is a portion of the case 46 and in which the fixed contact 41, the movable contact 42, and the tray portion 42d that are present on the upper side in the z direction are visible may be made of a transparent material or a material having translucency, and the remaining region (second region 462) of the case 46 may be made of a non-transparent material (see FIG. 25).

In FIG. 25, the terminal portion (second terminal 41b) on the side surface is omitted.

Even in this case, it is possible to visually recognize the operating state of the movable contact 42 and the amount of a fusing residue or the like accumulated above the tray portion 42d in the z direction from the outside of the first region 461 of the case 46.

When the tray portion 42d is attached in the vicinity of the lower end of the first region 461 in the z direction and then the second region 462 is attached to the first region 461, the tray portion 42d can be easily attached to the inside of the case 46.

The first region 461 and the second region 462 may be fixed by adhesion or welding, or may be fixed by screwing.

(Cap 49)

Figure 15:
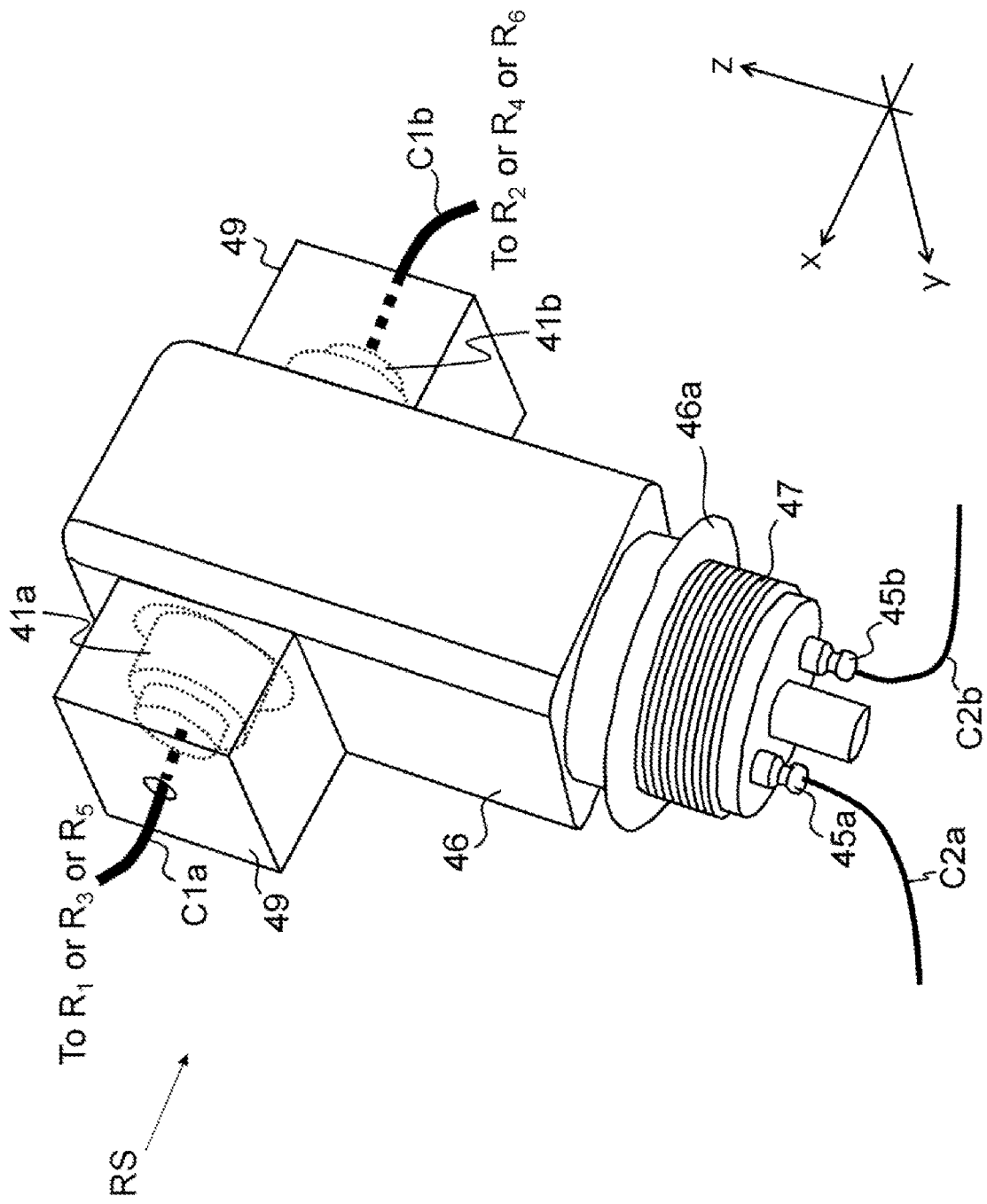
FIG. 15 is a perspective view of a relay to which a cap is attached.
Figure 16:
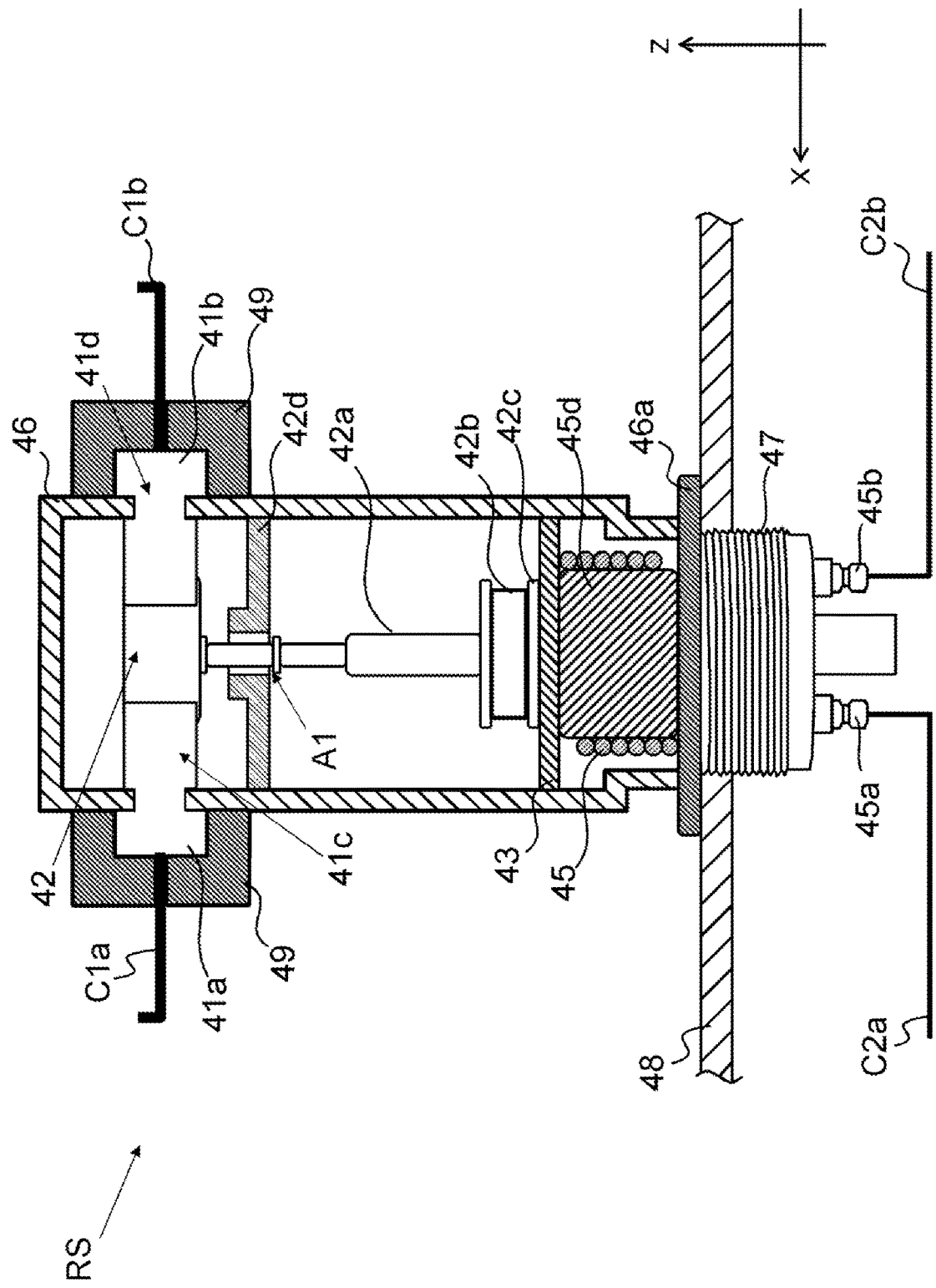
FIG. 16 is a cross-sectional view of the relay to which the cap is attached as viewed from the rear.
Figure 17:
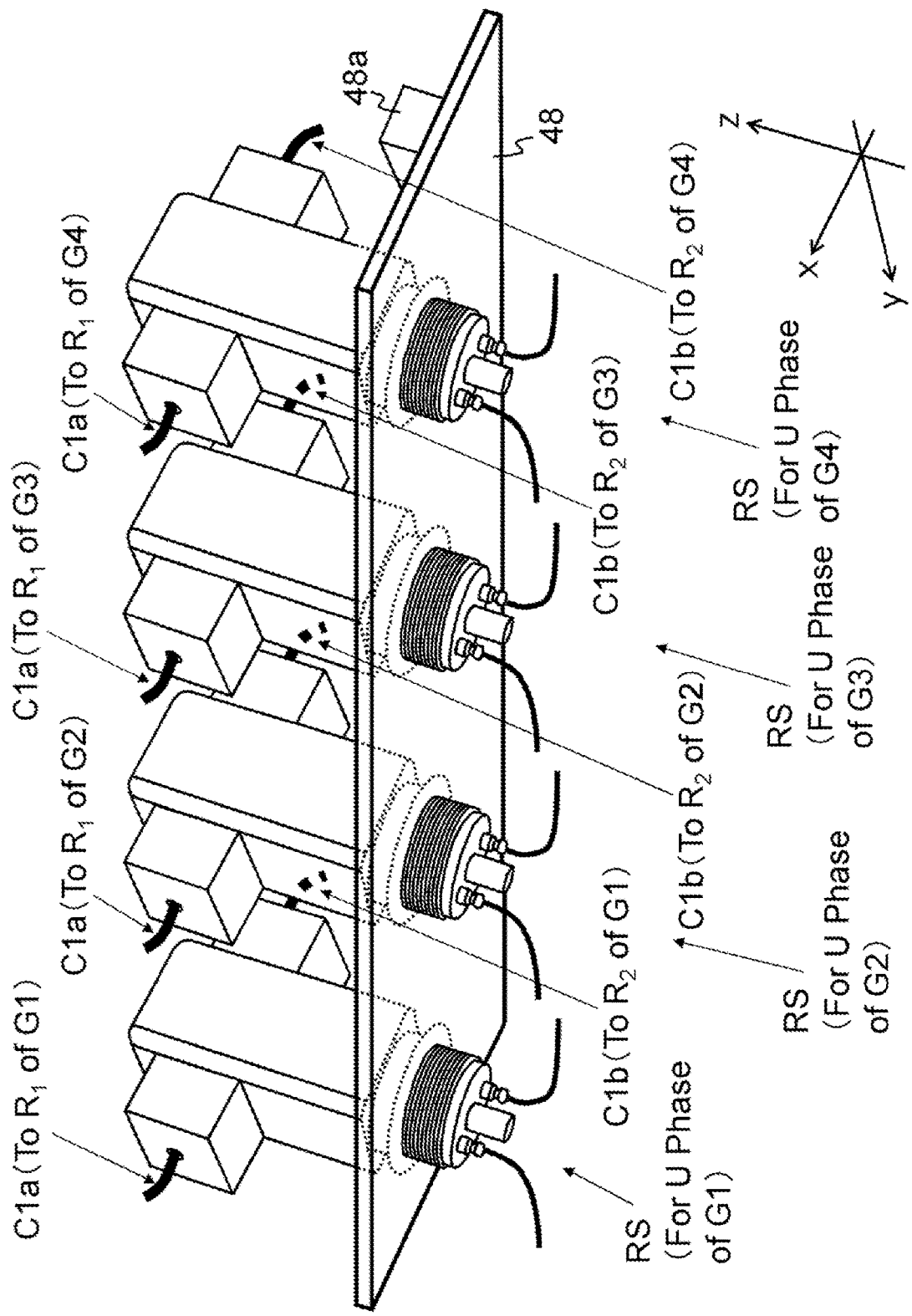
FIG. 17 is a perspective view illustrating a state in which four relays for U-phase to which caps are attached and a sensor unit are attached to a fixing portion.

It is desirable that each of the first terminal 41a connected to one end of the fixed contact 41 and the second terminal 41b connected to the other end of the fixed contact 41 be provided with the cap 49 that covers a metal portion exposed from the case 46 (see FIGS. 15 to 17).

The cap 49 is made of an insulating material such as rubber or resin.

(Effect of Providing Cap 49)

By covering the first terminal 41a and the second terminal 41b with the cap 49, the exposed metal portions of the first terminal 41a and the second terminal 41b are hidden, and the possibility that a short circuit occurs between the first terminal 41a and the second terminal 41b can be reduced.

The cap 49 attached to the first terminal 41a and the cap 49 attached to the second terminal 41b may be formed separately or integrally.

However, it is desirable that the cap 49 cover not all but a portion of the case 46 in order to increase a portion where the case 46 is in contact with the outside air and to enable visual recognition of a state (change in a temperature, change in internal members, and the like) inside the case 46.

In this case, when the cap 49 is attached to the case 46, at least a portion (for example, the lower half of the case 46 or the like) of the case 46 is exposed without being covered with the cap 49.

(Fixing Portion 48)

The relay RS is attached to the fixing portion 48.

The fixing portion 48 has a horizontal surface perpendicular to the z direction, and the relay RS is attached such that the case 46 is positioned on the upper horizontal surface in the z direction.

When the relay RS is attached to the fixing portion 48, the flange-shaped portion of the base 46a is in contact with the upper surface of the fixing portion 48 in the z direction, and the attachment portion 47 is inserted into the hole of the fixing portion 48.

A nut (not illustrated) is screwed to the attachment portion 47 from the lower side in the z direction, whereby the relay RS is attached to the fixing portion 48 in a state where the base 46a and the nut pinch the fixing portion 48 in the z direction.

The fixing portion 48 is attached to the load testing apparatus 1 in a state where the surface to which the relay RS is attached faces upward.

(Effect of Attaching Relays RS to Fixing Portion 48)

The relay RS is mounted on the horizontal surface of the fixing portion 48 such that the fixed contact 41 and the movable contact 42 are positioned above the tray portion 42d and the drive member 45 in the z direction.

As a result, it is possible to cause the movable contact 42 to perform a predetermined operation or stop at a predetermined position, in a state in which the movable contact 42 is hardly affected by gravity.

All the relays RS may be attached to one fixing portion 48.

Alternatively, the relays RS may be attached separately to a plurality of fixing portions 48.

For example, it is conceivable that the fixing portion 48 includes three fixing plates, four relays RS (relay RS for the first resistor group G1, relay RS for the second resistor group G2, relay RS for the third resistor group G3, and relay RS for the fourth resistor group G4) for the U phase are attached to the first fixing plate (fixing portion for the U phase) (see FIG. 17), four relays RS for the V phase are attached to the second fixing plate (fixing portion for the V phase), and four relays RS for the W phase are attached to the third fixing plate (fixing portion for the W phase).

(Sensor Unit 48a of Fixing Portion 48)

The fixing portion 48 is desirably provided with a sensor unit 48a (see FIG. 17).

The sensor unit 48a detects vibration of the fixing portion 48, that is, vibration (vibration based on the separation/approach of the movable contact 42 from/to the fixed contact 41) inside the case 46, and transmits information on the detected vibration to the fixed control device 81 or the like.

The sensor unit 48a includes a vibration sensor that detects vibration of the fixing portion 48.

Specifically, the sensor unit 48a detects operational vibration inside the case 46 of the relay RS when at least one of the fixed contact 41 and the movable contact 42 is carbonized and the relay RS does not operate normally, that is, vibration based on an impact generated when the fixed contact 41 and the movable contact 42 come into contact with each other.

The abnormal operational vibration is detected by, for example, the sensor unit 48a recording in advance normal operational vibration of the relay RS and abnormal operational vibration of the relay RS, and determining whether the detected operational vibration is close to the abnormal operational vibration on the basis of a vibration waveform, a vibration frequency, and the like.

The detection of the abnormal operational vibration may be performed constantly or may be performed only within a predetermined time (for example, 2 seconds) after the on/off operation of the selection switch 60b has been performed.

In this case, a communication unit of the sensor unit 48a communicates with the fixed control device 81 to acquire information on the on/off operation of the selection switch 60b.

The sensor unit 48a includes the communication unit, and the communication unit of the sensor unit 48a transmits information (indicating that operational vibration at the time of abnormality has been detected) obtained by the sensor unit 48a to the fixed control device 81.

In a case where the fixing portion 48 includes a plurality of fixing plates, identification information by the sensor unit 48a provided on each fixing plate is also transmitted to the fixed control device 81.

This makes it possible to identify the sensor unit 48a that has detected the operational vibration at the time of abnormality, that is, the fixing plate for the relay RS that has emitted the operational vibration at the time of the abnormality.

The sensor unit 48a may be constituted by an RF tag including a vibration sensor and a communication unit, or the vibration sensor and the communication unit of the sensor unit 48a may be constituted by independent members.

Wireless communication means for wireless communication performed between the fixed control device 81 and the communication unit of the sensor unit 48a and between the mobile control device 82 and the communication unit of the sensor unit 48a is not limited to a communication system of the RF tag. For example, said wireless communication means transmits its identification information to the outside while said wireless communication means is in an on state, and IEEE 802.15.1 (Bluetooth (registered trademark)), IEEE 802.11 (wireless LAN), and the like are also conceivable as said wireless communication means.

Predetermined vibration detected by the sensor unit 48a may not be vibration when the relay RS does not operate normally, but may be vibration when the relay RS operates normally.

In this case, the communication unit of the sensor unit 48a communicates with the fixed control device 81 to acquire information regarding the on/off operation of the selection switch 60b.

In a case where the sensor unit 48a does not detect the predetermined vibration within a predetermined time thereinafter even though the on/off operation of the selection switch 60b has been performed, the sensor unit 48a determines that the relay RS is not normally operating, and the communication unit of the sensor unit 48a transmits information (indicating that the operational vibration in the normal state cannot be detected) obtained by the vibration sensor of the sensor unit 48a to the fixed control device 81.

Alternatively, in a case where the sensor unit 48a detects the predetermined vibration (when the relay RS operates normally), the sensor unit 48a determines that the relay RS operates normally, and the communication unit of the sensor unit 48a transmits information (indicating that the operational vibration at the normal state has been detected) obtained by the sensor unit 48a to the fixed control device 81.

When the fixed control device 81 does not receive the relay normality information although the on/off operation of the selection switch 60b is performed, the fixed control device 81 determines that the corresponding relay RS is not normally operating.

In addition, it is not limited to a mode in which the sensor unit 48a detects the predetermined vibration and determines abnormality of the relay RS, and it may be a mode in which the sensor unit 48a records vibration when the relay RS operates, and information regarding said vibration is transmitted to the fixed control device 81 via the communication unit of the sensor unit 48a.

In this case, the fixed control device 81 determines whether or not the relay RS is normally operating on the basis of the information regarding said vibration.

The abnormality determination of the relay RS can also be performed by the control unit 80 (fixed control device 81). However, in this case, every time the on/off operation of the selection switch 60b is performed, the relay normality information or information regarding said vibration is received from the sensor unit 48a. Therefore, a load on the control unit 80 increases.

In a case where the sensor unit 48a performs abnormality determination on the relay RS, only when abnormality is detected by the sensor unit 48a, relay abnormality information from the sensor unit 48a to the control unit 80 is received. Therefore, it is possible to suppress an increase in the load on the control unit 80.

(Main Switch 50)

The main switch 50 includes a vacuum circuit breaker (VCB) and the like. The main switch 50 is connected between the resistance unit 20 and the test target power supply (and provided on the U-phase line UB, the V-phase line VB, and the W-phase line WB). When the main switch 50 is in an on state, power from the test target power supply is supplied to the resistance unit 20. When the main switch 50 is in an off state, power supply from the test target power supply to the resistance unit 20 is stopped.

While the load testing apparatus 1 is operating normally, the main switch 50 is in the on state. When the control unit 80 (fixed control device 81) determines (detects abnormality), on the basis of the information acquired by the sensor unit 48a, that any one of the relays RS included in the load testing apparatus 1 is not normally operating, the main switch 50 is turned off, that is, off-control is performed to stop power supply from the test target power supply to the resistance unit 20.

In the off control, power supply from a driving power supply (auxiliary power supply) of the load testing apparatus to the fixed control device 81 and the operation unit 60 is continued, but power supply to the cooling fan 10 may be stopped. However, in order to sufficiently cool the resistance unit 20, it is desirable that the power supply to the cooling fan 10 is stopped after a lapse of a certain time (for example, after a lapse of 5 minutes,) from when the off control to stop the power supply to the resistance unit 20 is started.

(Operation Unit 60)

The operation unit 60 is provided with an on/off operation switch 60a for turning on or off the power supply of the load testing apparatus 1 and a selection switch 60b (first switch S1 to fourth switch S4) for adjusting a load amount (and selecting a resistor group for supplying power from the test target power supply).

When the main power supply of the load testing apparatus 1 is turned on by operating the on/off operation switch 60a, the first actuator 32a is operated to open the intake cover 32 and the second actuator 34a is operated to open the exhaust cover 34, on the basis of power supplied from the driving power supply (auxiliary power supply) of the load testing apparatus via a cable (auxiliary power supply cable) c2 that electrically connects the driving power supply (auxiliary power supply) of the load testing apparatus to the cooling fan 10. The fan of the cooling fan 10 rotates to send air taken in from the opening (intake port 31) of the intake cover 32 to the resistance unit 20 present on the upper side. In addition, the fixed control device 81 operates on the basis of power supplied from the driving power supply (auxiliary power supply) of the load testing apparatus 1.

In the present embodiment, a mode in which the sensor unit 48a operates with a built-in battery will be described, but a mode in which the sensor unit 48a operates on the basis of power supplied from the driving power supply of the load testing apparatus 1 may be used.

An on/off switch for the cooling fan 10 may be provided separately from the on/off operation switch 60a, and said on/off switch for the cooling fan 10 may be operated to start rotation of the fan of the cooling fan 10 in a state where the main power supply of the load testing apparatus 1 is turned on by operating the on/off operation switch 60a.

After the main power supply of the load testing apparatus 1 is turned on, when the selection switch 60b (first switch S1 to fourth switch S4) is operated to make it possible to energize the resistance unit 20, the main switch 50 is turned on. In addition, the relays RS for the resistor group corresponding to the selection switch 60b (the first switch S1 or the like) that has selected the energization are turned on, and power is supplied from the test target power supply connected via the main switch 50 to the resistor group that can be energized in the resistance unit 20.

For example, when the first switch S1 and the second switch S2 are operated to be in an on state and the third switch S3 and the fourth switch S4 are operated to be in an off state, the relays RS for the first resistor group G1 and the second resistor group G2 having the rated capacity of 5 kW corresponding to the first switch S1 and the second switch S2 are turned on, and power from the test target power supply is supplied to the first resistor group G1 and the second resistor group G2. In addition, the relays RS for the third resistor group G3 and the fourth resistor group G4 having the rated capacity of 10 kW corresponding to the third switch S3 and the fourth switch S4 are turned off, and power from the test target power supply is not supplied to the third resistor group G3 and the fourth resistor group G4.

(Relay Abnormality Warning Unit 61)

Figure 18:
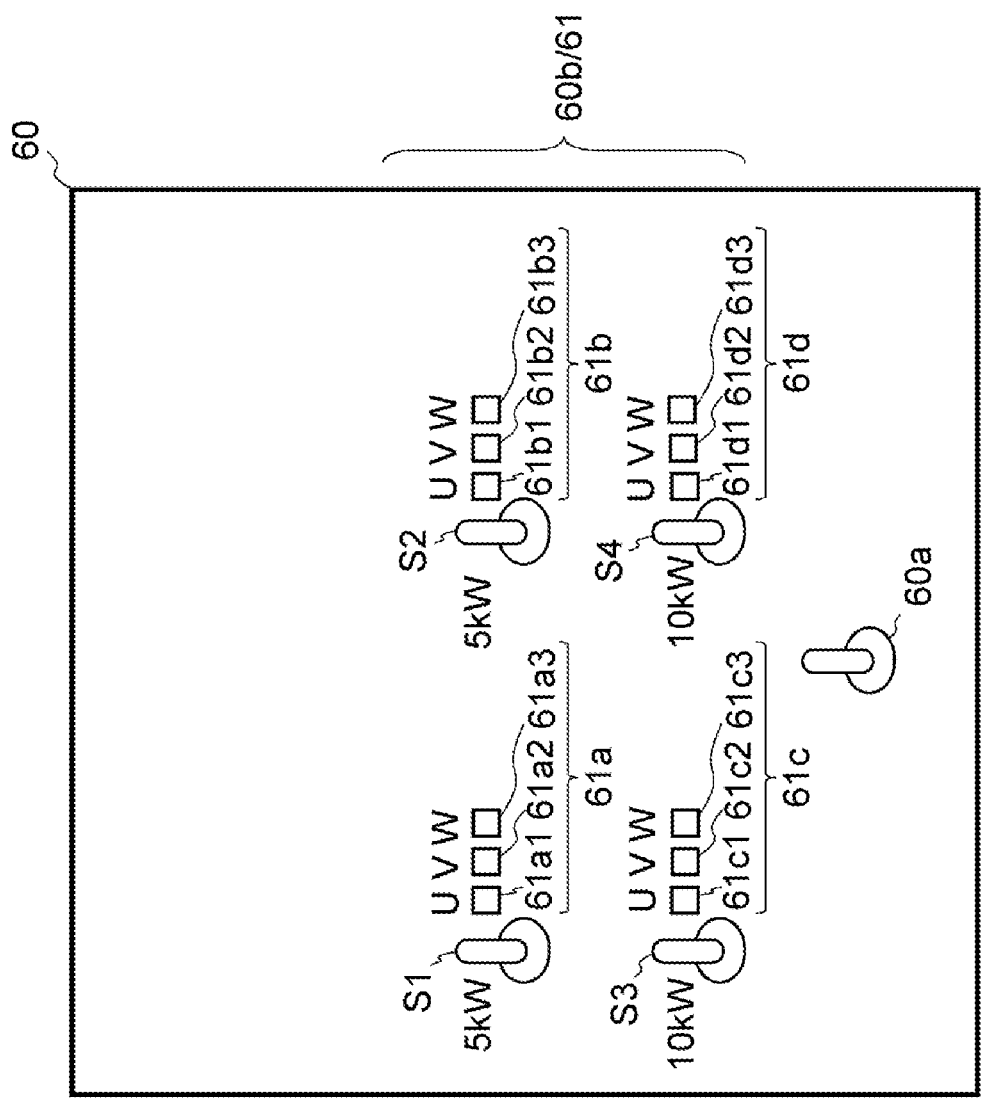
FIG. 18 is a schematic diagram illustrating a configuration of an operation unit.

The operation unit 60 is provided with a relay abnormality warning unit 61, and the relay abnormality warning unit 61 performs warning output according to a state of a member (relay RS) corresponding to the relay abnormality warning unit 61 (see FIG. 18).

The relay abnormality warning unit 61 includes a first warning unit 61a to a fourth warning unit 61d.

The first warning unit 61a corresponds to the relays RS for the first resistor group G1 and is provided in the vicinity of the first switch S1.

The second warning unit 61b corresponds to the relays RS for the second resistor group G2 and is provided in the vicinity of the second switch S2.

The third warning unit 61c corresponds to the relays RS for the third resistor group G3 and is provided in the vicinity of the third switch S3.

The fourth warning unit 61d corresponds to the relays RS for the fourth resistor group G4 and is provided in the vicinity of the fourth switch S4.

The first warning unit 61a includes a first U-phase warning unit 61a1, a first V-phase warning unit 61a2, and a first W-phase warning unit 61a3.

The first U-phase warning unit 61a1 lights up for warning when the operational vibration of the U-phase relay RS for the first resistor group G1 when the first switch S1 is operated is not normal.

The first U-phase warning unit 61a1 uses light to indicate that the off control has been performed on the basis of information acquired by the sensor unit 48a of the fixing portion 48 (first fixing plate) to which the U-phase relay RS for the first resistor group G1 is attached.

The first V-phase warning unit 61a2 lights up for warning when the operational vibration of the V-phase relay RS for the first resistor group G1 when the first switch S1 is operated is not normal.

The first V-phase warning unit 61a2 uses light to indicate that the off-control has been performed on the basis of information acquired by the sensor unit 48a of the fixing portion 48 (second fixing plate) to which the V-phase relay RS for the first resistor group G1 is attached.

The first W-phase warning unit 61a3 lights up for warning when the operational vibration of the W-phase relay RS for the first resistor group G1 when the first switch S1 is operated is not normal.

The first W-phase warning unit 61a3 uses light to indicate that the off-control has been performed on the basis of information acquired by the sensor unit 48a of the fixing portion 48 (third fixing plate) to which the W-phase relay RS for the first resistor group G1 is attached.

The second warning unit 61b includes a second U-phase warning unit 61b1, a second V-phase warning unit 61b2, and a second W-phase warning unit 61b3.

The second U-phase warning unit 61b1 lights up for warning when the operational vibration of the U-phase relay RS for the second resistor group G2 when the second switch S2 is operated is not normal.

The second U-phase warning unit 61b1 uses light to indicate that the off control has been performed on the basis of information acquired by the sensor unit 48a of the fixing portion 48 (first fixing plate) to which the U-phase relay RS for the second resistor group G2 is attached.

The second V-phase warning unit 61b2 lights up for warning when the operational vibration of the V-phase relay RS for the second resistor group G2 when the second switch S2 is operated is not normal.

The second V-phase warning unit 61b2 uses light to indicate that the off-control has been performed on the basis of information acquired by the sensor unit 48a of the fixing portion 48 (second fixing plate) to which the V-phase relay RS for the second resistor group G2 is attached.

The second W-phase warning unit 61b3 lights up for warning when the operational vibration of the W-phase relay RS for the second resistor group G2 when the second switch S2 is operated is not normal.

The second W-phase warning unit 61b3 uses light to indicate that the off-control has been performed on the basis of information acquired by the sensor unit 48a of the fixing portion 48 (third fixing plate) to which the W-phase relay RS for the second resistor group G2 is attached.

The third warning unit 61c includes a third U-phase warning unit 61c1, a third V-phase warning unit 61c2, and a third W-phase warning unit 61c3.

The third U-phase warning unit 61c1 lights up for warning when the operational vibration of the U-phase relay RS for the third resistor group G3 when the third switch S3 is operated is not normal.

The third U-phase warning unit 61c1 uses light to indicate that the off control has been performed on the basis of information acquired by the sensor unit 48a of the fixing portion 48 (first fixing plate) to which the U-phase relay RS for the third resistor group G3 is attached.

The third V-phase warning unit 61c2 lights up for warning when the operational vibration of the V-phase relay RS for the third resistor group G3 when the third switch S3 is operated is not normal.

The third V-phase warning unit 61c2 uses light to indicate that the off control has been performed on the basis of information acquired by the sensor unit 48a of the fixing portion 48 (second fixing plate) to which the V-phase relay RS for the third resistor group G3 is attached.

The third W-phase warning unit 61c3 lights up for warning when the operational vibration of the W-phase relay RS for the third resistor group G3 when the third switch S3 is operated is not normal.

The third W-phase warning unit 61c3 uses light to indicate that the off-control has been performed on the basis of information acquired by the sensor unit 48a of the fixing portion 48 (third fixing plate) to which the W-phase relay RS for the third resistor group G3 is attached.

The fourth warning unit 61d includes a fourth U-phase warning unit 61d1, a fourth V-phase warning unit 61d2, and a fourth W-phase warning unit 61d3.

The fourth U-phase warning unit 61d1 lights up for warning when the operational vibration of the U-phase relay RS for the fourth resistor group G4 when the fourth switch S4 is operated is not normal.

The fourth U-phase warning unit 61d1 uses light to indicate that the off control has been performed on the basis of information acquired by the sensor unit 48a of the fixing portion 48 (first fixing plate) to which the U-phase relay RS for the fourth resistor group G4 is attached.

The fourth V-phase warning unit 61d2 lights up for warning when the operational vibration of the V-phase relay RS for the fourth resistor group G4 when the fourth switch S4 is operated is not normal.

The fourth V-phase warning unit 61d2 uses light to indicate that the off control has been performed on the basis of information acquired by the sensor unit 48a of the fixing portion 48 (second fixing plate) to which the V-phase relay RS for the fourth resistor group G4 is attached.

The fourth W-phase warning unit 61d3 lights up for warning when the operational vibration of the W-phase relay RS for the fourth resistor group G4 when the fourth switch S4 is operated is not normal.

The fourth W-phase warning unit 61d3 uses light to indicate that the off control has been performed on the basis of information acquired by the sensor unit 48a of the fixing portion 48 (third fixing plate) to which the W-phase relay RS for the fourth resistor group G4 is attached.

For example, in a case where the operational vibration of the V-phase relay RS for the first resistor group G1 is not normal when the first switch S1 is operated, the first V-phase warning unit 61a2 of the first warning unit 61a lights up for warning. In this case, the first V-phase warning unit 61a2 uses light to indicate that the off control has been performed on the basis of information acquired by the sensor unit 48a of the fixing portion 48 (second fixing plate) to which the V-phase relay RS for the first resistor group G1 is attached.

Each unit of the relay abnormality warning unit 61 may light up (for example, light up in green) in another color during normal operation in addition to lighting up for warning (for example, lighting up in red).

(Control Unit 80)

The control unit 80 includes the fixed control device 81.

The fixed control device 81 is a control device fixed to the inside or the like of the housing 30 that holds the resistance unit 20.

The fixed control device 81 is a device that controls each unit of the load testing apparatus 1, such as the relays RS, the cooling fan 10, and the main switch 50. In particular, the fixed control device 81 detects the operating states of the relays RS for the resistor group corresponding to the selection switch 60b (first switch S1 to fourth switch S4) by the sensor unit 48a, and then performs the off control (off control of power supply from the test target power supply to the resistance unit 20) of the main switch 50.

That is, the fixed control device 81 performs the off-control on the basis of information acquired by the sensor unit 48a.

The fixed control device 81 turns off the main switch 50 on the basis of relay abnormality information from the sensor unit 48a, and stops the power supply from the test target power supply to the resistance unit 20 of the load testing apparatus 1. The fixed control device 81 issues a warning indicating that "the operation of the relay RS at the time of the switch operation is not normal".

Specifically, when receiving the relay abnormality information from the sensor unit 48a attached to the fixing portion 48, among the fixing portions of the fixing portion 48, the fixed control device 81 identifies a fixing portion whose sensor unit 48a has detected abnormal vibration, and among the selection switches of the selection switch 60b, the fixed control device 81 identifies a selection switch which has been turned on or off immediately before the detection of the abnormal vibration.

When the sensor unit 48a of the first fixing plate detects abnormal vibration and the third switch S3 is turned on or off immediately before the detection of the abnormal vibration, the fixed control device 81 determines that the relay RS corresponding to the third switch S3 and provided for the U phase is abnormal.

The fixed control device 81 causes the relay abnormality warning unit 61 corresponding to the identified relay RS, to light up.

That is, the fixed control device 81 identifies the relay RS that is not normally operating, on the basis of the relay abnormality information from the sensor unit 48a and the operating state of the selection switch 60b, and performs the off control to stop the power supply from the test target power supply to the resistance unit 20.

As an example of the warning indicating that "the operation of the relay RS at the time of the switch operation is not normal", a mode is conceivable in which, among the warning units of the relay abnormality warning unit 61 that are provided in the vicinity of the first switch S1 to the fourth switch S4 in the operation unit 60, a warning unit corresponding to a relay RS in which there is a high possibility that a failure has occurred lights up.

Figure 19:
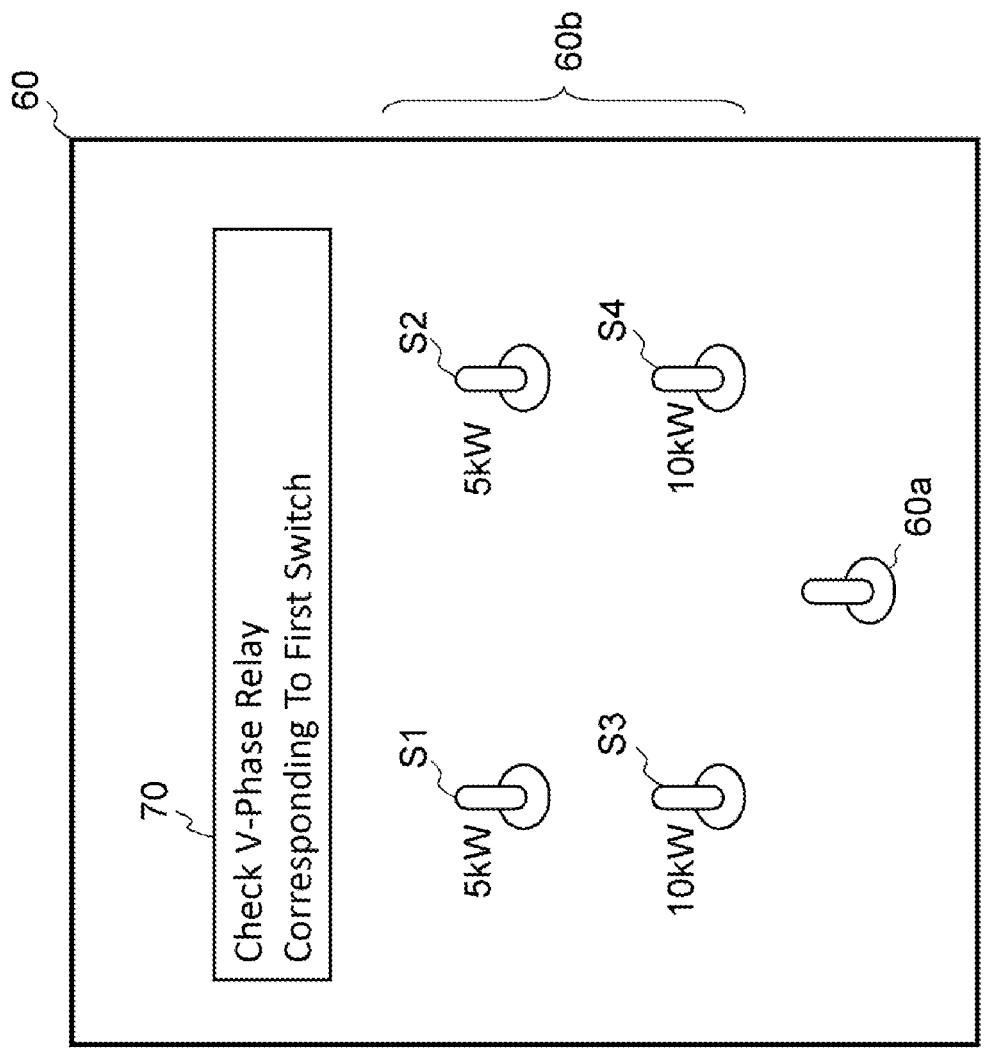
FIG. 19 is a schematic diagram illustrating a configuration of the operation unit in a mode in which a display device is provided in the operation unit.

Furthermore, a display device 70 capable of displaying characters may be provided in the operation unit 60 or the like, and a message "(Since the V-phase relay for the first resistor group corresponding to the first switch is not normal,) Check the relay (V-phase relay for the first resistor group) corresponding to the first switch." may be displayed, for example (see FIG. 19).

(Effect of Providing Sensor Unit 48a)

When abnormal vibration is detected by the sensor unit 48a of the fixing portion 48 to which the U-phase relays RS are attached, it can be seen that abnormality is present in the U-phase relays RS. When abnormal vibration is detected by the sensor unit 48a of the fixing portion 48 to which the V-phase relays RS are attached, it can be seen that abnormality is present in the V-phase relays RS. When abnormal vibration is detected by the sensor unit 48a of the fixing portion 48 to which the W-phase relays RS are attached, it can be seen that abnormality is present in the W-phase relays RS.

In addition, since the selection switch 60b that has been turned on or off immediately before the abnormal vibration is detected can be identified, it is also possible to specifically specify which relay RS has an abnormality.

In the present embodiment, it is not necessary to provide the member (sensor unit 48a) for detecting abnormality of a relay RS, on the power supply lines, such as the U-phase line UB, between the test target power supply and the resistance unit 20.

Therefore, abnormality of a relay RS of the load testing apparatus 1 can be easily detected without complicating the wiring of the power supply lines extending to the resistance unit.

Note that the communication unit of the sensor unit 48a may communicate with the control unit 80 in a wireless manner or may communicate with the control unit 80 in a wired manner.

In a case where wireless communication with the control unit 80 is performed, it is possible to detect abnormality of a relay RS only by attaching the sensor unit 48a to the fixing portion 48 without considering wiring.

In particular, in a case where the sensor unit 48a includes a battery that drives each unit of the sensor unit 48a, a cable for sending a control signal to the sensor unit 48a and a cable for supplying power to the sensor unit 48a are unnecessary.

Therefore, the sensor unit 48a can be easily provided in a region where complicated wiring is provided between the resistors R and the relays RS.

(Transmission to Mobile Terminal)

Furthermore, the control unit 80 to which the relay abnormality information is transmitted from the sensor unit 48a is not limited to the control device (fixed control device 81) fixed to the housing 30 holding the resistance unit 20, and may be a control device (mobile control device 82) such as a mobile terminal.

In this case, the sensor unit 48a and the mobile control device 82 constitute a relay abnormality detection system of the load testing apparatus 1.

When the relay abnormality information is transmitted from the sensor unit 48a to a mobile terminal including the mobile control device 82, a display unit of said mobile terminal functions as the relay abnormality warning unit 61 and displays information regarding the relay RS in which abnormality has been detected.

For example, a mode is conceivable in which a message "(Since the V-phase relay for the first resistor group corresponding to the first switch is not normal,) Check the relay (V-phase relay for the first resistor group) corresponding to the first switch." is displayed on the display unit of the mobile terminal, as with the display device 70.

Note that the control unit 80 may have only one of the fixed control device 81 and the mobile control device 82, or may have both the fixed control device 81 and the mobile control device 82.

In a case where the control unit 80 does not include the fixed control device 81 but includes only the mobile control device 82, the warning output is performed in response to the detection of abnormality of a relay RS, but the off control may not be performed.

In addition, even in a case where the control unit 80 includes the fixed control device 81, the warning output is performed in response to the detection of abnormality of a relay RS, but the off control may not be performed.

For example, the sensor unit 48a records in advance operational vibration of the relay RS in a normal state, operational vibration of the relay RS in an abnormal state, and operational vibration of the relay RS in an intermediate state between the normal state and the abnormal state, and determines whether detected operational vibration is close to the operational vibration in the abnormal state, the operational vibration in the intermediate state, or the operational vibration in the normal state on the basis of a vibration waveform, a vibration frequency, and the like, thereby detecting the abnormal operational vibration.

When the detected operational vibration is close to the operational vibration in the abnormal state, both the warning output and the off control are performed, and when the detected operational vibration is close to the operational vibration in the intermediate state, the warning output is performed without performing the off control.

(Specific Example of Load Testing Apparatus)

Figure 20:
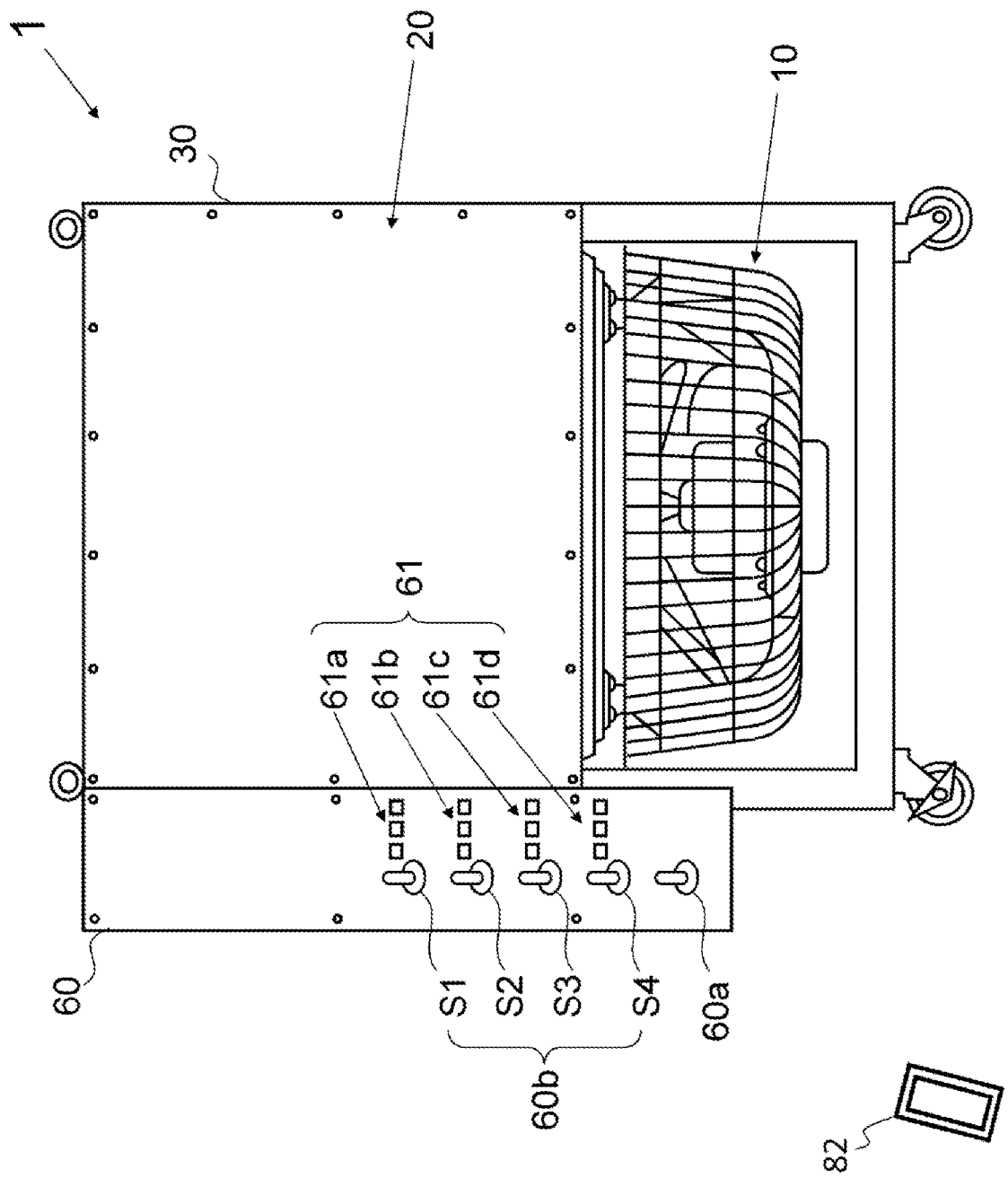
FIG. 20 is a side view of a low-voltage load testing apparatus that uses relay abnormality detection according to the present embodiment.
Figure 21:
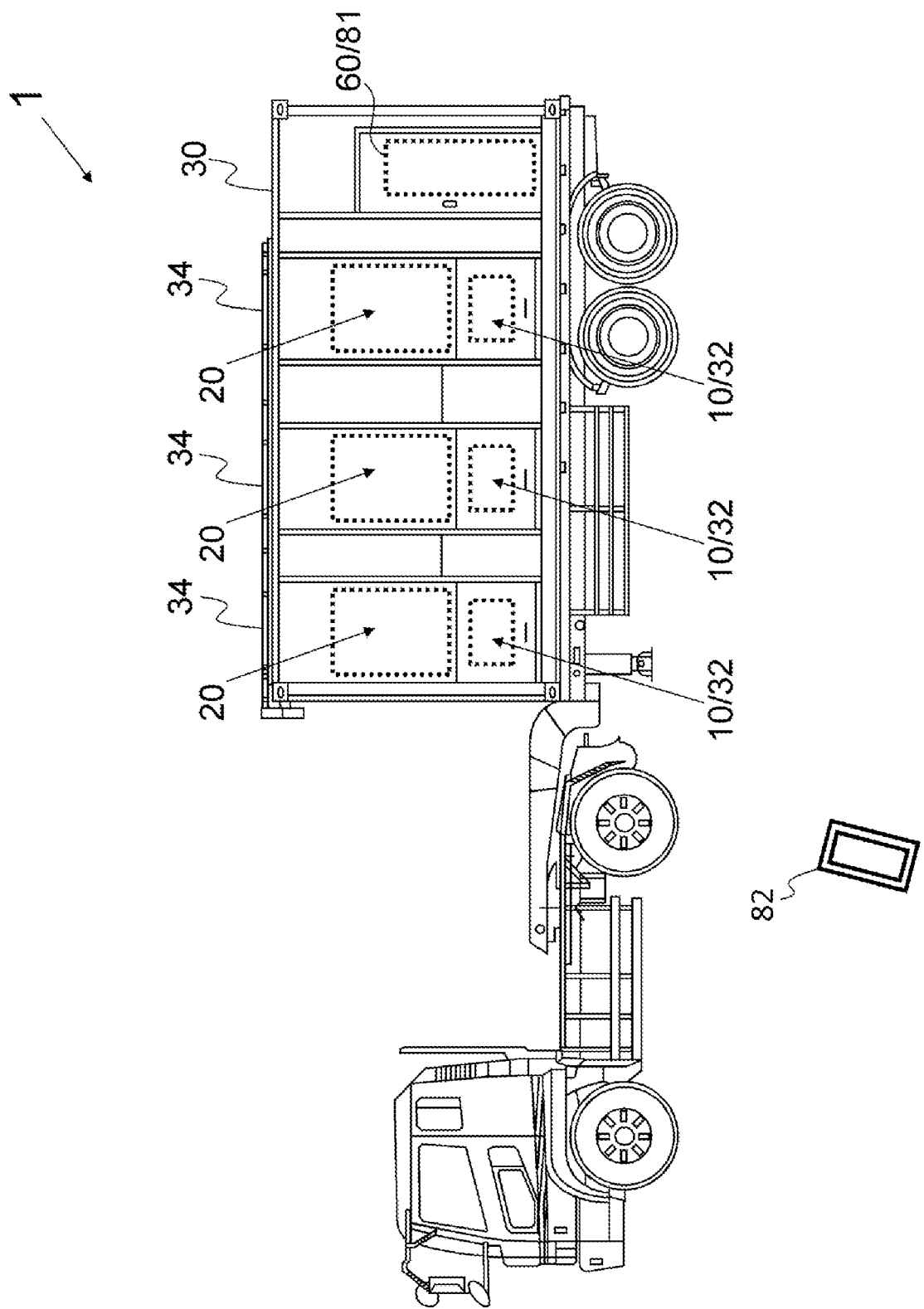
FIG. 21 is a side view of a high-voltage load testing apparatus that uses relay abnormality detection according to the present embodiment.

The load testing apparatus 1 according to the present embodiment can be used for a low-voltage load testing apparatus compatible with a low-voltage power supply as illustrated in FIG. 20, or can be used for a high-voltage load testing apparatus compatible with a high-voltage power supply as illustrated in FIG. 21.

However, a load testing apparatus 1 is also provided in which at least one of the intake cover 32 and the exhaust cover 34 is omitted and at least one of the intake port 31 and the exhaust port 33 is always opened. In this case, at least one of the first actuator 32a and the second actuator 34a is omitted (see FIG. 20).

In addition, the warning may be in the form of output using light to be visually recognized by a user, may be in the form of sound output, or may be in the form of output using both.

(Emergency Stop Switch)

In the embodiment, the off control is performed when abnormality of each unit of the load testing apparatus 1 is detected.

However, the off control may be performed by the operation of the user when the load testing apparatus 1 performs the warning output without performing the automatic off control.

In this case, operation unit 60 includes an emergency stop switch 63 (see FIG. 22).

When the emergency stop switch 63 is operated by the user, the fixed control device 81 turns off the main switch 50 to stop the power supply from the test target power supply to the resistance unit 20.

In this case, the fixed control device 81 continues the power supply from the auxiliary power supply to the fixed control device 81 and the operation unit 60, and stops the power supply to the cooling fan 10. However, in order to sufficiently cool the resistance unit 20, it is desirable that the power supply to the cooling fan 10 is stopped after a lapse of a certain time (for example, after a lapse of 5 minutes,) from when the off control to stop the power supply to the resistance unit 20 is started.

(Impact Absorbing Portion 44)

In the present embodiment, a mode in which the fixed contact 41 and the movable contact 42 are in direct contact with each other has been described. However, at least one of the fixed contact 41 and the movable contact 42 may be provided with an impact absorbing portion 44 including a conductive elastic member, and the fixed contact 41 and the movable contact 42 may be electrically connected to each other via the impact absorbing portion 44 (see FIGS. 23 and 24).

FIGS. 23 and 24 illustrate an example in which the impact absorbing portion 44 including an elastic member constituted by a spring is attached to the fixed contact 41.

(Effect of Providing Impact Absorbing Portion 44)

In this case, the expansion and contraction of the elastic member of the impact absorbing portion 44 makes it possible to absorb an impact when the fixed contact 41 and the movable contact 42 come into contact with each other.

In addition, the urging force of the elastic member of the impact absorbing portion 44 applies a force that separates the movable contact 42 from the fixed contact 41, and the magnetic force of the coil of the drive member 45 applies a force that causes the movable contact 42 to approach the fixed contact 41.

These forces in directions opposite to each other enable the fixed contact 41 and the movable contact 42 to maintain a contact state (maintain a closed state) more firmly.

(Application Example of Sensor Unit 48*a*)

In the present embodiment, the example in which the sensor unit 48*a* is attached to the fixing portion 48 to which the relays RS are attached has been described.

However, the sensor unit 48*a* may be directly attached to each of the cases 46 of the relays RS.

In this case, a sensor of the sensor unit 48*a* may perform not only abnormality detection based on vibration but also abnormality detection based on a temperature, abnormality detection based on a sound, and the like.

In this case, the sensor of the sensor unit 48*a* includes at least one of a temperature sensor that detects the temperature of the case 46 and a vibration sensor that detects vibration (vibration based on the separation/approach of the movable contact 42 from/to the fixed contact 41) inside the case 46.

As the abnormality detection based on the temperature, for example, a mode is conceivable in which the relay RS is determined to be abnormal when the temperature of the surface of the case 46 exceeds a temperature threshold.

As the abnormality detection based on a sound, for example, a mode is conceivable in which the relay RS is determined to be abnormal when a sound at the time of the movement of the movable contact 42 by the on/off control of the drive member 45 is different from a sound in a normal state.

(Application to Other than Load Testing Apparatus 1)

In the present embodiment, the example in which the relays RS are used for the on/off control of power supply to the resistors of the load testing apparatus 1 has been described.

However, the relays RS may be used for on/off control to another apparatus.

In particular, even in the case where the tray portion 42*d* is provided, the impact absorbing portion 44 is provided, the diode 45*c* is provided, the yoke 45*d* is provided, the case 46 is made transparent, the relay RS is disposed on the horizontal surface, the sensor unit 48*a* is provided, and the like, even when they are used for on/off control to another apparatus (apparatus including the relay RS), the same effects as those obtained when the load testing apparatus 1 is used can be obtained.

Although some embodiments of the present invention have been described, these embodiments have been presented as examples, and are not intended to limit the scope of the invention. These embodiments can be implemented in various other forms, and various omissions, substitutions, and changes can be made without departing from the gist of the invention. These embodiments and modifications thereof are included in the scope and gist of the invention and are included in the invention described in the claims and the equivalent scope thereof.

REFERENCE SIGNS LIST

1 Load testing apparatus
10 Cooling fan
20 Resistance unit
30 Housing
31 Intake port
32 Intake cover
32*a* First actuator
33 Exhaust port
34 Exhaust cover
34*a* Second actuator
41 Fixed contact
41*a*, 41*b* First terminal, Second terminal
41*c* Fixed contact on first terminal side
41*d* Fixed contact on second terminal side
42 Movable contact
42*a* Movable contact holding portion
42*b* Return member
42*c* Base portion
42*d* Tray portion
43 Partition wall
44 Impact absorbing portion
45 Drive member (coil)
45*a*, 45*b* Third terminal, Fourth terminal
45*c* Diode
45*d* Yoke
46 Case
461 First region
462 Second region
46*a* Base
47 Attachment portion 48 Fixing portion
48a Sensor unit
49 Cap
50 Main switch
60 Operation unit
60a On/off operation switch
60b Selection switch
61 Relay abnormality warning unit
61a to 61d First warning unit to fourth warning unit
61a1 to 61d1 First U-phase warning unit to fourth U-phase warning unit
61a2 to 61d2 First V-phase warning unit to fourth V-phase warning unit
61a3 to 61d3 First W-phase warning unit to fourth W-phase warning unit
63 Emergency stop switch
70 Display device
80 Control unit
81 Fixed control device
82 Mobile control device
A1 Hole provided in region that physically interferes with moving region of movable contact holding portion
c1 Test target power supply cable
C1a First power supply cable
C1b Second power supply cable
c2 Auxiliary power supply cable
C2a First control cable
C2b Second control cable
G1 to G4 First resistor group to fourth resistor group
$R_1$ to $R_6$ First resistor to sixth resistor
RS Relay
S1 to S4 First switch to fourth switch
$U_1$ U-phase terminal
UB U-phase line
$V_1$ V-phase terminal
VB V-phase line
$W_1$ W-phase terminal
WB W-phase line

The invention claimed is:

1. A relay comprising:
a fixed contact;
a movable contact;
a return member of the movable contact; and
a case that covers the fixed contact, the movable contact, and the return member, wherein
the relay is used for on/off control of power supply to a resistor of the load testing apparatus from a high-voltage test target power supply,
a lower portion of the case is mounted on a horizontal surface such that the fixed contact is positioned above the return member,
at least upper portion of the case is made of a material having transparency or translucency, so that the fixed contact and the movable contact visible from above and from side.

2. The relay according to claim 1, further comprising
a cap that covers a portion of a terminal connected to the fixed contact, the portion being exposed from the case, wherein
at least a portion of the case is exposed without being covered with the cap when the cap is attached to the case.

3. The relay according to claim 1, wherein
a first region of the case that covers the fixed contact is made of a material having transparency or translucency,
a second region of the case lower than the first region is made of a non-transparent material, and
the first region and the second region are fixed by adhesion or welding.

4. An apparatus comprising the relay according to claim 3, wherein a fixing portion including the horizontal surface is provided with a sensor unit including a vibration sensor that detects vibration inside the case.

5. The relay according to claim 1, wherein the case is provided with a sensor unit including at least one of a temperature sensor that detects a temperature of the case and a vibration sensor that detects vibration inside the case.

6. The relay according to claim 1, wherein
the relay is in an open state in which the fixed contact and the movable contact are not in contact with each other when the relay is off, the relay is in a closed state in which the fixed contact and the movable contact are in contact with each other when the relay is on, and
a diode is electrically connected to an end of a coil of a drive member that moves the movable contact.

7. The relay according to claim 1, wherein
one of the fixed contact and the movable contact is provided with an impact absorbing portion including a conductive elastic member, and
the fixed contact and the movable contact are electrically connected to each other via the impact absorbing portion.

8. The relay according to claim 1, wherein a yoke is provided on at least one of an inside and an outside of a coil of a drive member that moves the movable contact.

9. A relay comprising:
a fixed contact;
a movable contact;
a return member of the movable contact;
a case that covers the fixed contact, the movable contact, and the return member, and
a tray portion that is disposed above the return member and below the fixed contact and holds a fusing residue generated by separation/approach of the movable contact from/to the fixed contact,
wherein the case is made of a material having transparency or translucency.

10. A load testing apparatus comprising:
a resistor; and
the relay according to claim 9 that is used for on/off control of power supply to the resistor.

* * * * *